(12) United States Patent
Kamigaichi et al.

(10) Patent No.: US 7,405,440 B2
(45) Date of Patent: Jul. 29, 2008

(54) NONVOLATILE SEMICONDUCTOR MEMORY

(75) Inventors: Takeshi Kamigaichi, Kanagawa (JP); Hiroyuki Kutsukake, Kanagawa (JP); Kikuko Sugimae, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 181 days.

(21) Appl. No.: 10/983,744

(22) Filed: Nov. 9, 2004

(65) Prior Publication Data

US 2005/0139904 A1  Jun. 30, 2005

(30) Foreign Application Priority Data

Dec. 26, 2003  (JP) .............. 2003-435825

(51) Int. Cl.
*H01L 29/788* (2006.01)
(52) U.S. Cl. ............... 257/314; 257/316; 257/E29.129; 257/E29.3
(58) Field of Classification Search ................. 257/314, 257/316, E29.129, E29.3
See application file for complete search history.

(56) References Cited

U.S. PATENT DOCUMENTS

| 6,251,728 | B1 * | 6/2001 | Patelmo et al. ............. 438/257 |
| 6,265,739 | B1 | 7/2001 | Yaegashi et al. |
| 6,569,742 | B1 * | 5/2003 | Taniguchi et al. ............ 438/303 |
| 6,933,199 | B1 * | 8/2005 | Wong et al. ................. 438/275 |
| 2003/0030123 | A1 | 2/2003 | Ichige et al. |
| 2005/0139904 | A1 | 6/2005 | Kamigaichi et al. |

FOREIGN PATENT DOCUMENTS

| JP | 7-142589 | 6/1995 |
| JP | 11-317503 | 11/1999 |
| JP | 2000-269448 | 9/2000 |
| JP | 2002-280463 | 9/2002 |
| JP | 2003-60092 | 2/2003 |

OTHER PUBLICATIONS

U.S. Appl. No. 11/219,724, filed Sep. 7, 2005, Kutsukake et al.
U.S. Appl. No. 11/246,168, filed Oct. 11, 2005, Kamigaichi et al.
U.S. Appl. No. 11/877,833, filed Oct. 24, 2007, Kutsukake et al.
U.S. Appl. No. 10/214,582, filed Aug. 9, 2002, inventor Masayuki Ichige, et al.

* cited by examiner

*Primary Examiner*—Trung Dang
(74) *Attorney, Agent, or Firm*—Oblon, Spivak, McClelland, Maier & Neustadt, P.C.

(57) ABSTRACT

A nonvolatile semiconductor memory on a semiconductor chip includes: a cell array region configured with a memory cell transistor having a first metallic salicide film, a first control gate electrode electrically coupled with the first metallic salicide film, and a floating gate electrode adjacent to the first control gate electrode; a high voltage circuit region including a high voltage transistor made of a second metallic salicide film, a first source region and a first drain region, and a first gate region arranged between the first source region and the first drain region; and a low voltage circuit region including a low voltage transistor made of a third metallic salicide film, a second source region and a second drain region electrically coupled with the third metallic salicide film, and a second gate region arranged between the second source region and the second drain region and is electrically coupled with the third metallic salicide film.

12 Claims, 19 Drawing Sheets

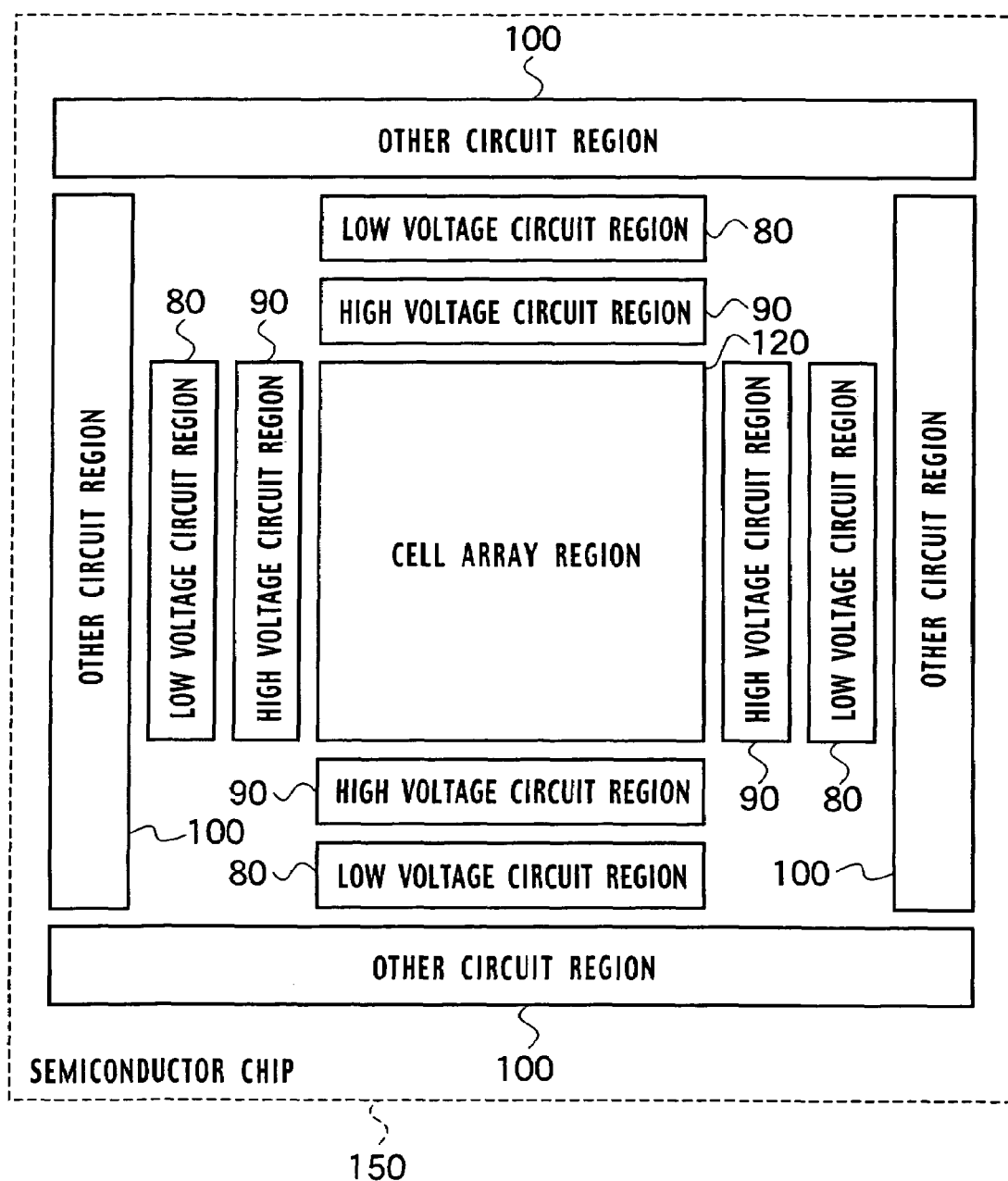

NONVOLATILE SEMICONDUCTOR MEMORY

CROSS REFERENCE TO RELATED APPLICATIONS

This application is based upon and claims the benefit of priority from prior Japanese Patent Applications P2003-435825 filed on Dec. 26, 2003; the entire contents of which are incorporated by reference herein.

BACKGROUND OF THE INVENTION

1. Field of the Invention

The present invention relates to a nonvolatile semiconductor memory. More specifically, it relates to a nonvolatile semiconductor memory, which employs a metallic salicide film as an electrode film.

2. Description of the Related Art

Conventionally, an electrically erasable programmable read-only memory (EEPROM), which electrically performs data write-in and erasure, for example, has been known as a nonvolatile semiconductor memory (R. Shirota, 'A Review of 256 Mbit NAND Flash Memories and NAND Flash Future Trend', Nonvolatile Semiconductor Memory Workshop (NVSMW), 2000, p. 22-31). In this EEPROM, especially a NAND type, a memory cell array is configured by disposing memory cell transistors at the respective intersections of word lines in the row direction and bit lines in the column direction. A MOS transistor having a stacked gate structure configured by stacking a floating gate and a control gate, for example, is typically used as a memory cell transistor.

As presented in R. Shirota, 'A Review of 256 Mbit NAND Flash Memories and NAND Flash Future Trend', Nonvolatile Semiconductor Memory Workshop (NVSMW), 2000, p. 22-31, a NAND-type flash memory has a structure with multiple memory cell transistors connected in series forming a NAND string, and select transistors are arranged on both sides thereof, respectively. Furthermore, a memory cell array is configured with device isolating regions arranged in parallel to device activating regions in the memory cell transistor. Typically, the gate length of each select transistor is longer than that of a memory cell transistor, preventing deterioration in transistor cutoff characteristics due to a short channel effect. In addition, the select transistor is typically configured with an enhancement-type MOS transistor.

A structure of a nonvolatile semiconductor memory, which uses a memory cell transistor configured from two types of transistors such as a memory cell transistor and a select transistor and has differing gate oxide thicknesses for the memory transistor unit and the select transistor unit, respectively, has already been disclosed (Japanese Laid-open Patent Application No. 2000-269361).

In addition, a structure with the film thickness of the gate oxide of the gate electrode of a select MOS transistor differing from that of a peripheral circuit MOS transistor has already been disclosed (Japanese Laid-open Patent Application No. Hei 04-165670).

Furthermore, a structure of a flash memory having the peripheral transistors being formed through a salicide process and the memory cell transistor region being formed with the salicide-covered control gates and the not-covered salicide diffused layers in a memory cell unit, and a fabrication method thereof has been proposed (Japanese Laid-open Patent Application No. 2003-60092).

With a conventional nonvolatile semiconductor memory such as a flash EEPROM and the like, a high voltage circuit region is necessary for supplying a high-voltage pulse such as a write-in voltage, an intermediate voltage or an erasure voltage to a memory cell array region. There are also conventional low voltage circuit regions that must operate at a low voltage and high speed.

However, usage of a transistor in the low voltage circuit region capable of operating with a higher driving capability at a higher speed is advantageous. In the low voltage circuit region of a flash EEPROM, which is operable at a low power supply voltage, ensuring the transistor driving capability is a particular objective. As the large scale integrating capacity of a memory cell array increases, improving write-in and read-out speed by decreasing the resistance on word lines in a memory cell transistor region becomes a more significant issue.

A transistor with an improved transistor driving capability and higher speed performance is necessary in the low voltage circuit regions. With the high capacity memory cell array, formation of a metallic salicide film on a gate or a diffused layer is one method for decreasing the resistance on word lines in the memory cell transistor region so as to improve write-in and read-out speed.

However, with the nonvolatile semiconductor memory such as a flash EEPROM, when forming a metallic salicide film on the gates or diffused layers of all circuit regions, as with CMOS logic circuits, avoiding an increase in junction leaks or degradation in junction withstand voltage or surface withstand voltage is an objective with the transistors in the high voltage circuit regions, which are arranged for generating a high voltage of 15V or higher such as a write-in voltage $V_{pgm}$ or erasure voltage $V_{erase}$.

Especially with a NAND-type memory cell transistor, a problem of junction leaks or junction withstand voltage becomes evident since it requires a higher voltage than an AND or NOR type.

SUMMARY OF THE INVENTION

An aspect of the present invention inheres in a nonvolatile semiconductor memory on a semiconductor chip, including: a cell array region configured with a memory cell transistor comprising a first metallic salicide film, a first control gate electrode, which is electrically coupled with the first metallic salicide film, and a floating gate electrode, which is adjacent to the first control gate electrode; a high voltage circuit region including a high voltage transistor, which is made up of a second metallic salicide film, a first source region and a first drain region, and a first gate region, which is arranged between the first source region and the first drain region; and a low voltage circuit region including a low voltage transistor, which is made up of a third metallic salicide film, a second source region and a second drain region, which are electrically coupled with the third metallic salicide film, and a second gate region, which is arranged between the second source region and the second drain region and is electrically coupled with the third metallic salicide film.

Another aspect of the present invention inheres in a nonvolatile semiconductor memory on a semiconductor chip, including: a cell array region configured with a memory cell transistor, which comprises a first metallic salicide film, a first control gate electrode, which is electrically coupled with the first metallic salicide film, an insulating film, and a floating gate electrode, which is stacked on the first control gate electrode via the insulating film; a high voltage circuit region including a high voltage transistor, which comprises a second metallic salicide film, a first source region and a first drain region, and a first gate region, which is arranged between the first source region and the first drain region and is electrically coupled with the second metallic salicide film; and a low voltage circuit region including a low voltage transistor, which comprises a third metallic salicide film, a second source region and a second drain region, which is electrically coupled with the third metallic salicide film, and a second gate region, which is arranged between the second source region and the second drain region and is electrically coupled with the third metallic salicide film, wherein both of the first gate region and the second gate region are configured of a single layer.

BRIEF DESCRIPTION OF DRAWINGS

FIG. 1A is a schematic top plan view of a nonvolatile semiconductor memory according to first through fourth embodiments of the present invention;

DETAILED DESCRIPTION OF THE INVENTION

Figure 1B:
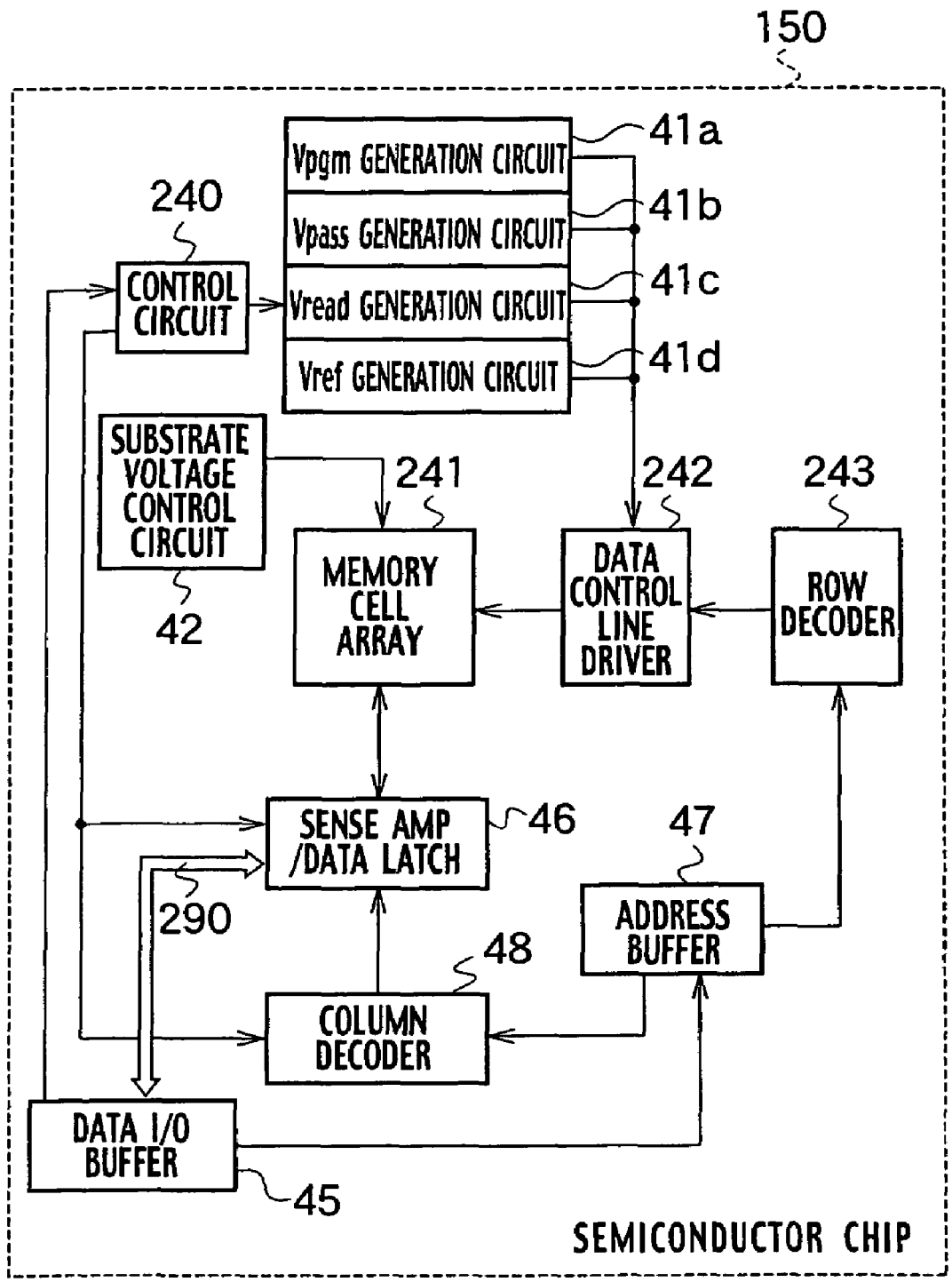
FIG. 1B is an example of a block diagram of a nonvolatile semiconductor memory including with high voltage transistor regions and low voltage transistor regions according to first through fourth embodiments of the present invention.
Figure 2A:
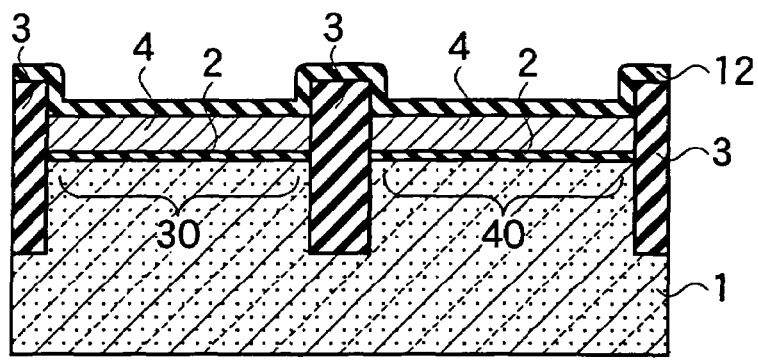
FIG. 2A is a schematic device cross-sectional diagram of a low voltage circuit for explaining a step of a nonvolatile semiconductor memory fabrication method according to the first embodiment of the present invention.
Figure 2B:
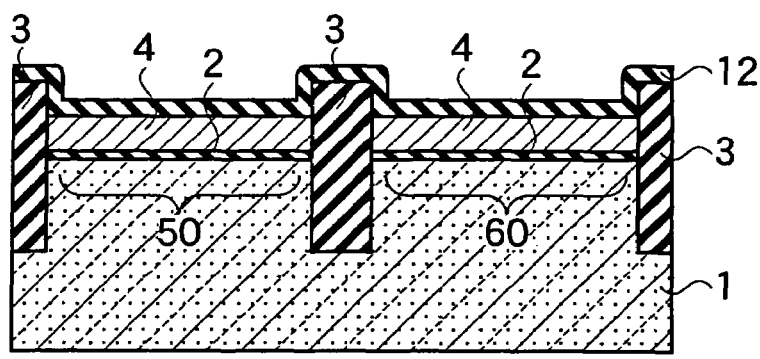
FIG. 2B is a schematic device cross-sectional diagram of a high voltage circuit for explaining a step of the nonvolatile semiconductor memory fabrication method according to the first embodiment of the present invention.
Figure 2C:
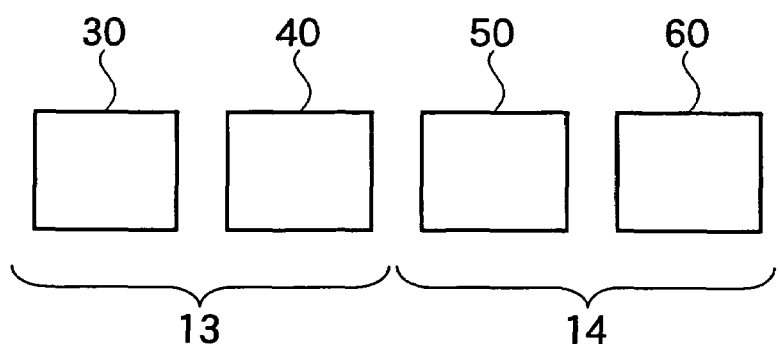
FIG. 2C is an aerial view of a corresponding schematic device pattern for explaining a step of the nonvolatile semiconductor memory fabrication method according to the first embodiment of the present invention.
Figure 2D:
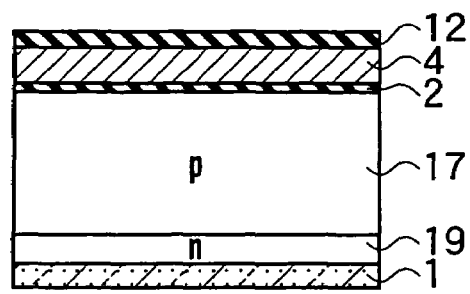
FIG. 2D is a schematic device cross-sectional diagram of a corresponding cell array region for explaining a step of the nonvolatile semiconductor memory fabrication method according to the first embodiment of the present invention.
Figure 3A:
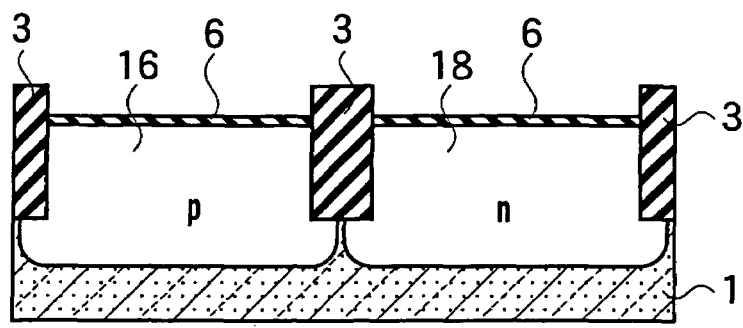
FIG. 3A is a schematic device cross-sectional diagram of a low voltage circuit for explaining a step of a nonvolatile semiconductor memory fabrication method according to the first embodiment of the present invention.
Figure 3B:
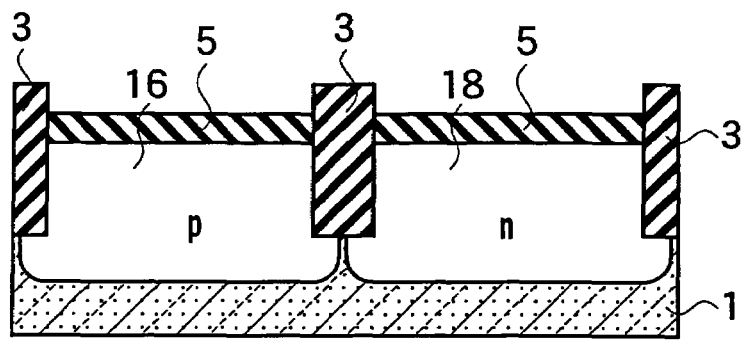
FIG. 3B is a schematic device cross-sectional diagram of a high voltage circuit for explaining a step of the nonvolatile semiconductor memory fabrication method according to the first embodiment of the present invention.
Figure 3C:
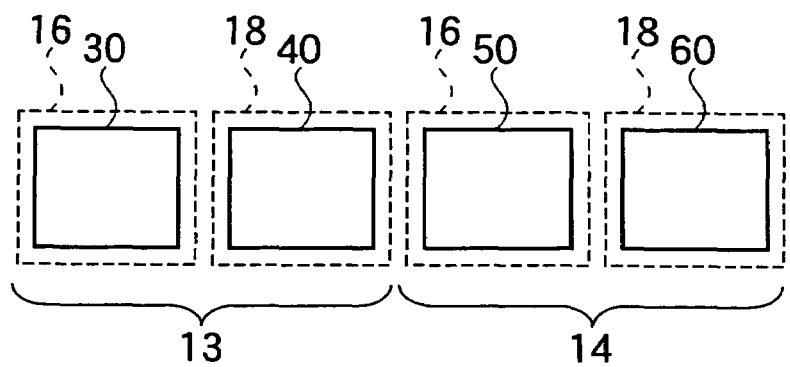
FIG. 3C is an aerial view of a corresponding schematic device pattern for explaining a step of the nonvolatile semiconductor memory fabrication method according to the first embodiment of the present invention.
Figure 3D:
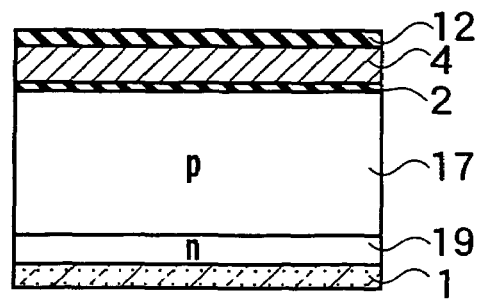
FIG. 3D is a schematic device cross-sectional diagram of a corresponding cell array region for explaining a step of the nonvolatile semiconductor memory fabrication method according to the first embodiment of the present invention.
Figure 4A:
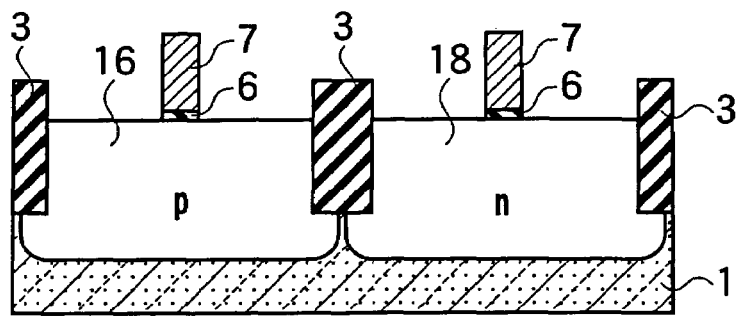
FIG. 4A is a schematic device cross-sectional diagram of a low voltage circuit for explaining a step of a nonvolatile semiconductor memory fabrication method according to the first embodiment of the present invention.
Figure 4B:
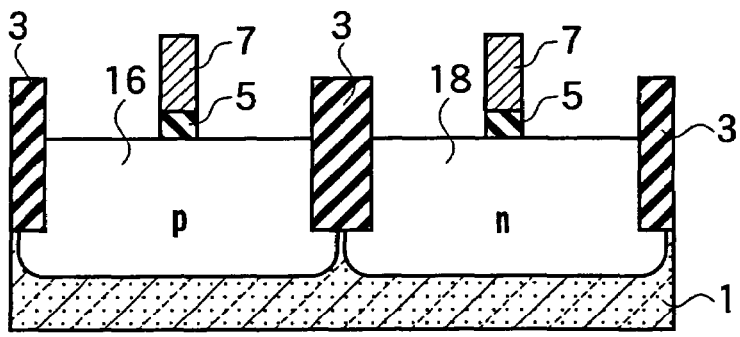
FIG. 4B is a schematic device cross-sectional diagram of a high voltage circuit for explaining a step of the nonvolatile semiconductor memory fabrication method according to the first embodiment of the present invention.
Figure 4C:
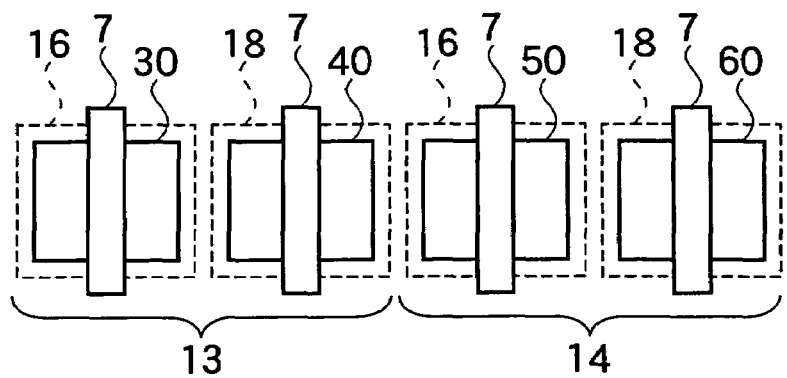
FIG. 4C is an aerial view of a corresponding schematic device pattern for explaining a step of the nonvolatile semiconductor memory fabrication method according to the first embodiment of the present invention.
Figure 4D:
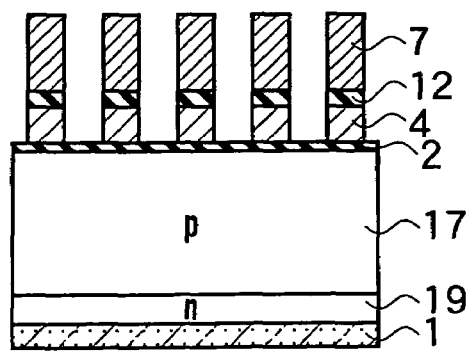
FIG. 4D is a schematic device cross-sectional diagram of a corresponding cell array region for explaining a step of the nonvolatile semiconductor memory fabrication method according to the first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as is conventional in the representation of the circuit blocks, it will be appreciated that the various drawings are not drawn to scale from one figure to another nor inside a given figure, and in particular that the circuit diagrams are arbitrarily drawn for facilitating the reading of the drawings.

The embodiments shown below exemplify an apparatus and a method that are used to implement the technical ideas according to the present invention, and do not limit the technical ideas according to the present invention to those that appear below. These technical ideas, according to the present invention, may receive a variety of modifications that fall within the claims.

First through fourth embodiments of the present invention are described forthwith while referencing the drawings. The same or similar symbols are given to the same or similar parts throughout the appended drawings. However, it should be noted that the drawings are merely schematics and that the relationship between thickness and planar dimension and the ratio of respective layer thicknesses and the like differ from those of the actual invention. Accordingly, specific thicknesses and dimensions should be determined while considering the following description. Furthermore, that parts with differing dimensions and/or differing ratios among the drawings may be included.

In addition, the first through fourth embodiments given forthwith illustrate devices and methods for embodying the technical idea of the present invention, and technical idea of the present invention is not limited to the following materials, shapes, structures, arrangements or the like. The technical idea of the present invention may be modified into various modifications within the scope of the appended claims.

First Embodiment

The present invention provides a nonvolatile semiconductor memory, which concurrently implements enhanced transistors in low voltage circuit regions, highly integrated transistors, and high breakdown voltage transistors in high voltage circuit regions.

According to the present invention, a nonvolatile semiconductor memory, which may concurrently implement enhanced transistors of the low voltage circuit region arranged on the periphery of a memory cell array region, highly integrated transistors, and high breakdown voltage transistors of the high voltage circuit region arranged on the periphery of the same memory cell array region.

(Planar Pattern Block Structure)

FIG. 1A is a schematic top plan view of a nonvolatile semiconductor memory according to first through fourth embodiments of the present invention.

The schematic block structure of a nonvolatile semiconductor memory according to a first embodiment of the present invention includes, as shown in FIG. 1A for example, a cell array region 120, high voltage circuit regions 90, low voltage circuit regions 80, and other circuit regions 100. The other circuit regions 100 are a mixture of low voltage circuits, high voltage circuits and resistive element regions, arranged on a semiconductor chip 150. Each high voltage circuit region 90 is a circuit for applying to the cell array region 120, relatively high voltage pulses compared to a power supply voltage such as a write-in voltage $V_{pgm}$ or an erasure voltage $V_{erase}$. Each low voltage circuit region 80 is a logic circuit such as a CMOS, and is a circuit region that needs to operate at a relatively high speed with low power consumption. Arranged in the other circuit regions 100 circuits such as low voltage circuits, high voltage circuits, and resistive elements, which are used to generate a reference voltage or the like, other than those set particularly in the low voltage circuit regions 80 and the high voltage circuit regions 90.

The nonvolatile semiconductor memory according to the first embodiment of the present invention includes the cell array region 120, the high voltage circuit regions 90, the low voltage circuit regions 80 and the interconnect region in the other circuit regions 100. Furthermore, the cell array region 120 is connected to the low voltage circuits, the high voltage circuits, and the resistive elements within the other circuit regions 100, which are used to generate a reference voltage or the like.

FIG. 1B is an example of a block diagram of a nonvolatile semiconductor memory including with high voltage circuit regions and low voltage circuit regions according to first through fourth embodiments of the present invention.

As shown in FIG. 1B, the nonvolatile semiconductor memory of the first through fourth embodiments of the present invention includes a semiconductor chip 150 including a memory cell array 241. The high voltage circuit regions 90 in FIG. 1A includes, for example, a $V_{pgm}$ generation circuit 41a, a $V_{pass}$ generation circuit 41b, a $V_{read}$ generation circuit 41c, and a $V_{ref}$ generation circuit 41d, a data control line driver 242, and a row decoder 243 as shown in FIG. 1B. The low voltage circuit regions 80 in FIG. 1A, includes a sense amplifier/data latch 46 and a column decoder 48, as shown in FIG. 1B. Typically, the high voltage transistor is a transistor having an operational voltage of more than 15 V, and the low voltage transistor is a transistor having an operational voltage of less than 15 V.

As shown in FIG. 1B, the nonvolatile semiconductor memory includes a memory cell array 241 of a NAND, AND or virtual ground type, a data control line driver 242, a row decoder 243, an address buffer 47, a column decoder 48, a sense amplifier/data latch 46, a data I/O buffer 45, a substrate voltage control circuit 42, a control circuit 240, a $V_{pgm}$ generation circuit 41a, a $V_{pass}$ generation circuit 41b, a $V_{read}$ generation circuit 41c, and a $V_{ref}$ generation circuit 41d. An internal I/O line 290 is wired between the data I/O buffer 45 and the sense amplifier/data latch 46.

The memory cell array 241 is constituted, as described later, by arraying memory cell blocks in a matrix form, in each of which a nonvolatile memory cell transistor and a selecting gate transistor are connected in series or parallel. The sense amplifier/data latch 46 is provided to sense data on a data transfer line of the memory cell array 241, or latch written data. The sense amplifier/data latch 46 also serves as a data latch, and is constituted mainly of, for example, a flip-flop circuit. The sense amplifier/data latch 46 is connected to the data I/O buffer 45. The connection between the sense amplifier/data latch 46 and the data I/O buffer 45 is controlled based on an output of the column decoder 48, which receives an address signal from the address buffer 47. By this connection, data transferred from an external circuit to the data I/O buffer 45 can be written through the first internal I/O line 290 in the memory cell array 241. Data stored in the memory cell array 241 can be read out through the first internal I/O line 290 to the data I/O buffer 45. In the memory cell array 241, the row decoder 243 is constituted by an address selection circuit, which selects a memory cell transistor, specifically, and controls a data selection line and a block selection line.

The substrate voltage control circuit 42 controls a voltage of a p type semiconductor substrate or p type well region where the memory cell array 241 is formed, and preferably can be boosted to an erasure voltage of 10 V or higher during erasure. Additionally, the $V_{pgm}$ generation circuit 41a is formed to generate a write voltage $V_{pgm}$ that is boosted to a level higher than a power supply voltage when data is written in a memory cell element selected in the memory cell array 241. Separately from the $V_{pgm}$ generation circuit 41a, the $V_{pass}$ generation circuit 41b and the $V_{read}$ generation circuit 41c are disposed respectively to generate an intermediate voltage for writing $V_{pass}$ supplied to the unselected memory cell during data writing and an intermediate voltage $V_{read}$ for reading-out data supplied to the unselected memory cell during data read-out. The $V_{pgm}$ generation circuit 41a, $V_{pass}$ generation circuit 41b and $V_{read}$ generation circuit 41c are controlled by the control circuit 240 so that a necessary voltage output can be applied to the data control line driver 242 in each of the write-in, erasure and read-out states.

The write voltage $V_{pgm}$ ranges from 6 V to 30 V inclusive, and the write intermediate voltage $V_{pass}$ ranges from 3 V to 15 V inclusive. The read-out intermediate voltage $V_{read}$ ranges from 1 V to 9 V inclusive. In the case of a NAND type array, preferably, the voltage applied to the data control line driver 242 is higher by about 1 V than an upper limit of a write threshold value in order to provide sufficient read-out current and to reduce the occurrence of read-disturb. The data control line driver 242 is a switch circuit for applying, in accordance with an output of the row decoder 243, the voltage output to the control gate electrode of the memory cell element or the gate electrode of the selecting gate transistor which requires writing or reading-out.

(Device Structure)

The nonvolatile semiconductor memory according to the first embodiment of the present invention, as shown in FIGS. 1 and 6, includes on the semiconductor chip 150 the cell array region 120, which is configured with memory cell transistors (FIG. 6D) including first metallic salicide films 11, first control gate electrodes 7 electrically coupled with the first metallic salicide films 11, and floating gate electrodes 4 adjacent to the first control gate electrodes 7 also included is the high voltage circuit regions 90 and 14, each including high voltage transistors (FIG. 6B) made up of second metallic salicide films 11, first source/drain regions 24, 25, 26 and 27, and first gate regions 74 and 73 arranged between the first source/drain regions 24, 25, 26 and 27 Low voltage circuit regions 80 and 13 and also provided, each including low voltage transistors (FIG. 6A) made up of third metallic salicide films 11, second source/drain regions 20, 21, 22 and 23 electrically coupled with the third metallic salicide films 11, and second gate regions 72 and 71 arranged between the second source/drain regions 20, 21, 22 and 23 and are electrically coupled with the third metallic salicide films 11.

In FIGS. 2 through 6, FIGS. 2A through 6A represent schematic device cross-sectional diagrams of the low voltage circuit regions 80. FIGS. 2B through 6B represent schematic device cross-sectional diagrams of the high voltage circuit regions 90. FIGS. 2C through 6C represent aerial views of schematic device patterns corresponding to FIGS. 2A through 6A and FIGS. 2B through 6B. FIGS. 2D through 6D represent schematic device cross-sectional diagrams of the corresponding cell array region 120.

FIGS. 7A through 9A are schematic cross-sectional diagrams of transistors in the low voltage circuit region 80. FIGS. 7B through 9B are schematic cross-sectional diagrams of transistors in the high voltage circuit region 90. FIGS. 7C through 9C are aerial views of corresponding schematic device patterns, respectively.

With the nonvolatile semiconductor memory according to the first embodiment of the present invention, the memory cell transistor has a stacked gate structure; however, each of the transistors in the low voltage circuit regions 80 and in the high voltage circuit regions 90 has a single-layered gate structure.

(Memory Cell Transistor Structure)

The nonvolatile semiconductor memory according to the first embodiment of the present invention, as shown in FIGS. 2D through 6D, has a stacked gate structure as a basic structure configured with a first electrode film 4, which provides floating gate electrodes, a gate oxide or seventh insulating film 12, as the first through the sixth insulating films are discussed later, which provides inter-layer insulating films, and second electrode films 7, which provides first control gate electrodes. The first metallic salicide films 11 are formed on the second electrode films 7 and electrically coupled therewith.

A detailed structure of the memory cell transistor in the nonvolatile semiconductor memory according to the first embodiment of the present invention includes, as shown in FIGS. 2D through 6D for example, a semiconductor substrate 1, a n-well region 19 and a p-well region 17 formed in the semiconductor substrate 1, a first insulating film 2, which provides tunnel insulating films, a first electrode film 4, which is arranged upon the first insulating film 2, a seventh insulating film 12, second electrode films 7, fourth insulating films 8, which are arranged on sidewalls of the stacked gate structure, and metallic salicide films 11, which are electrically coupled with the upper portion of the second electrode films 7. The second electrode films 7 correspond to the word lines, and the metallic salicide films 11 are used for word lines. It should be noted that in FIGS. 2D through 6D, descriptions of the source/drain regions and device isolating regions and the like in the memory cell transistor are omitted.

(Transistor Structure in Low Voltage Circuit Region)

The low voltage circuit region 80 includes, for example, as shown in FIGS. 2A through 9A, a p-well region 16 and a n-well region 18 formed in the semiconductor substrate 1, an nMOS transistor formed within the p-well region 16, and a pMOS transistor formed within the n-well region 18. Furthermore, the p-well region 16 and the n-well region 18 corresponding to the low voltage circuit region 13 shown in FIGS. 2A through 9A are arranged in the aerial views of the layout patterns given in FIGS. 2C through 9C. An nMOS formation region 30 is arranged in the p-well region 16 corresponding to the low voltage circuit region 13, and a pMOS formation region 40 is arranged in the n-well region 18.

The transistor structure of the low voltage circuit regions 80 and 13 in the nonvolatile semiconductor memory according to the first embodiment of the present invention includes, as shown in FIGS. 6A through 9A, second source/drain regions 20 and 21 in the nMOS transistor, a first gate region 72, which is arranged between the second source/drain regions 20 and 21, second source/drain regions 22 and 23 in the pMOS transistor, a second gate region 71, which is arranged between the second source/drain regions 22 and 23, and third metallic salicide films 11, which are electrically coupled with each of the second source/drain regions 20, 21, 22, and 23 and the second gate regions 72 and 71.

A detailed structure of the nMOS transistor in the low voltage circuit region 13 of the nonvolatile semiconductor memory according to the first embodiment of the present invention includes, as shown in FIGS. 6A through 9A for example, a semiconductor substrate 1, device isolation regions 3, a p-well region 16 formed in the semiconductor substrate 1, third insulating films 6, which become gate insulating films, an $n^+$ polysilicon gate electrode 72, which becomes a second gate region arranged on the third insulating films 6, n⁺ source/drain regions 20 and 21, which become second source/drain regions, n⁻ layers 28, which work as electric field relaxation layers arranged adjacent to the n⁺ source/drain regions 20 and 21, fourth insulating films 8, which are arranged on the sidewalls of the n⁺ polysilicon gate electrode 72, and third metallic salicide films 11, which are arranged on the n⁺ source/drain regions 20 and 21 and the n⁺ polysilicon gate electrode 72 electrically coupled therewith.

Similarly, a detailed structure of the pMOS transistor in the low voltage circuit region 13 of the nonvolatile semiconductor memory according to the first embodiment of the present invention includes, as shown in FIGS. 6A through 9A for example, the semiconductor substrate 1, the device isolation regions 3, the n-well region 18 formed in the semiconductor substrate 1, the third insulating films 6, which become gate insulating films, a p⁺ polysilicon gate electrode 71, which becomes a second gate region arranged on the third insulating films 6, p⁺ source/drain regions 22 and 23, which become second source/drain regions, p⁻ layers 29, which work as electric field relaxation layers arranged adjacent to the p⁺ source/drain regions 22 and 23, the fourth insulating films 8, which are arranged on the sidewalls of the p⁺ polysilicon gate electrode 71, and the third metallic salicide films 11, which are arranged on the p⁺ source/drain regions 22 and 23 and the p⁺ polysilicon gate electrode 71 electrically coupled therewith.

(Transistor Structure in High Voltage Circuit Region)

The high voltage circuit region 90 includes, for example, as shown in FIGS. 2B through 9B, the p-well region 16 and the n-well region 18 formed in the semiconductor substrate 1, the nMOS transistor formed within the p-well region 16, and the pMOS transistor formed within the n-well region 18. Furthermore, the p-well region 16 and the n-well region 18 corresponding to a high voltage circuit region 14 shown in FIGS. 2B through 9B are arranged in the aerial views of the layout patterns given in FIGS. 2C through 9C. An nMOS formation region 50 is arranged in the p-well region 16 corresponding to the high voltage circuit region 14, and a pMOS formation region 60 is arranged in the n-well region 18.

The transistor structure of the high voltage circuit regions 90 and 14 in the nonvolatile semiconductor memory according to the first embodiment of the present invention includes, as shown in FIGS. 6B through 9B, first source/drain regions 24 and 25 in the nMOS transistor, a first gate region 74, which is arranged between the second source/drain regions 24 and 25, first source/drain regions 26 and 27 in the pMOS transistor, a first gate region 73, which is arranged between the second source/drain regions 26 and 27, and second metallic salicide films 11, which electrically insulate all of the first source/drain regions 24, 25, 26 and 27 and the first gate regions 74 an 73, or are electrically coupled with part of them.

Figure 6A:
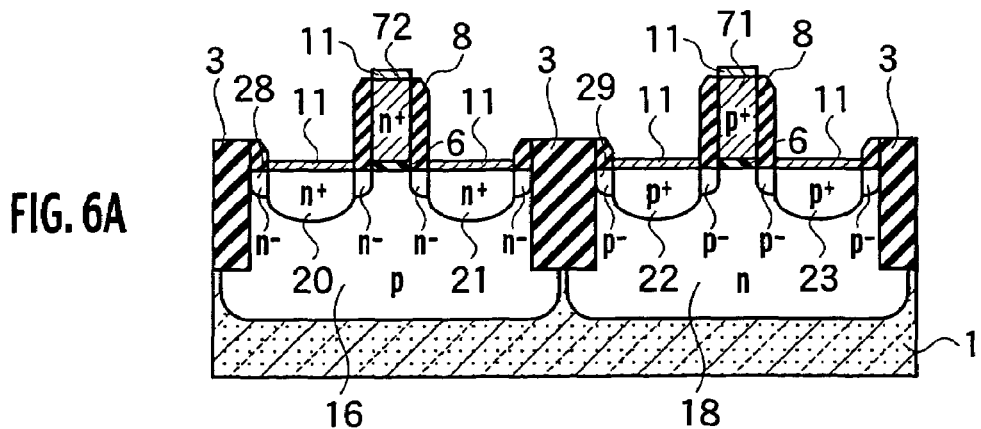
FIG. 6A is a schematic device cross-sectional diagram of a low voltage circuit for explaining a step of a nonvolatile semiconductor memory fabrication method according to the first embodiment of the present invention.
Figure 6B:
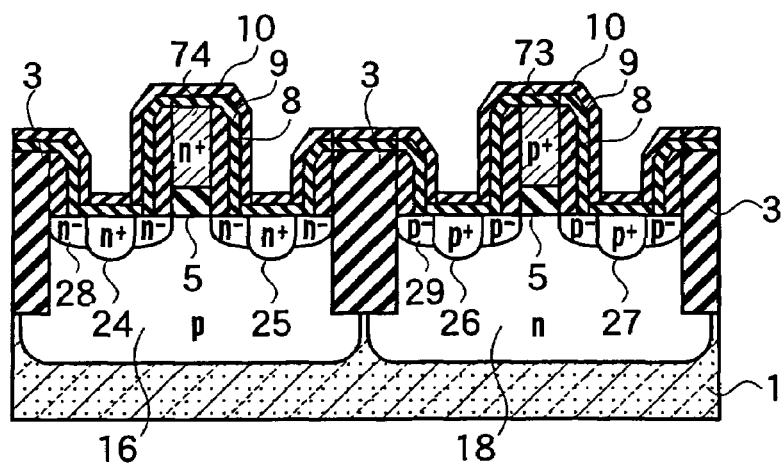
FIG. 6B is a schematic device cross-sectional diagram of a high voltage circuit for explaining a step of the nonvolatile semiconductor memory fabrication method according to the first embodiment of the present invention.
Figure 6C:
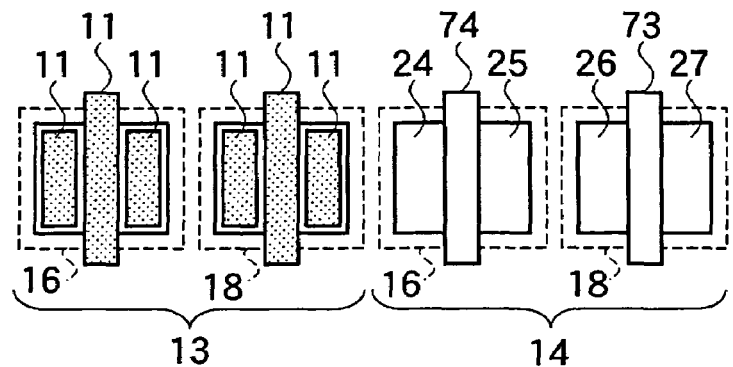
FIG. 6C is an aerial view of a corresponding schematic device pattern for explaining a step of the nonvolatile semiconductor memory fabrication method according to the first embodiment of the present invention.

The transistor structure of the high voltage circuit regions 90 and 14 in the nonvolatile semiconductor memory according to the first embodiment of the present invention is structured, with the first source/drain regions 23, 25, 26 and 27 and the first gate regions 74 and 73 of the nMOS transistor and the pMOS transistor being electrically insulated from the second metallic salicide films 11 or being electrically coupled therewith, as shown in FIG. 6B.

Figure 7A:
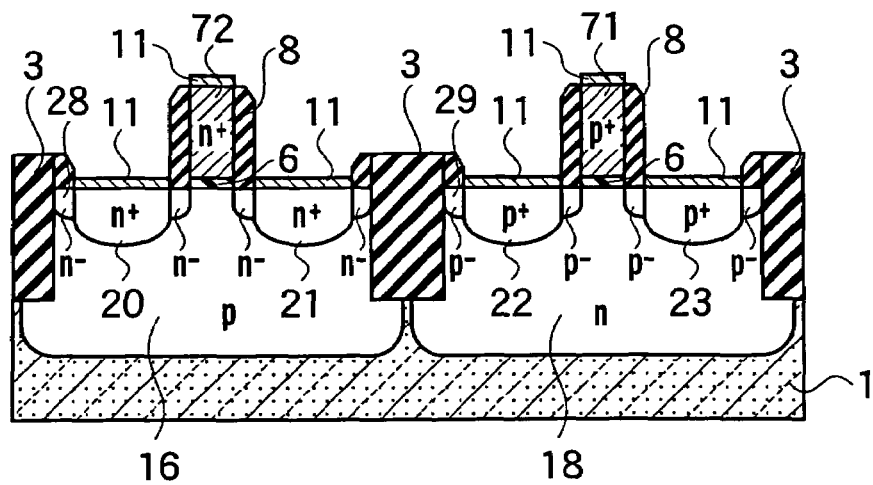
FIG. 7A is a schematic device cross-sectional diagram of a low voltage circuit for explaining a step of a nonvolatile semiconductor memory fabrication method according to the first embodiment of the present invention.
Figure 7B:
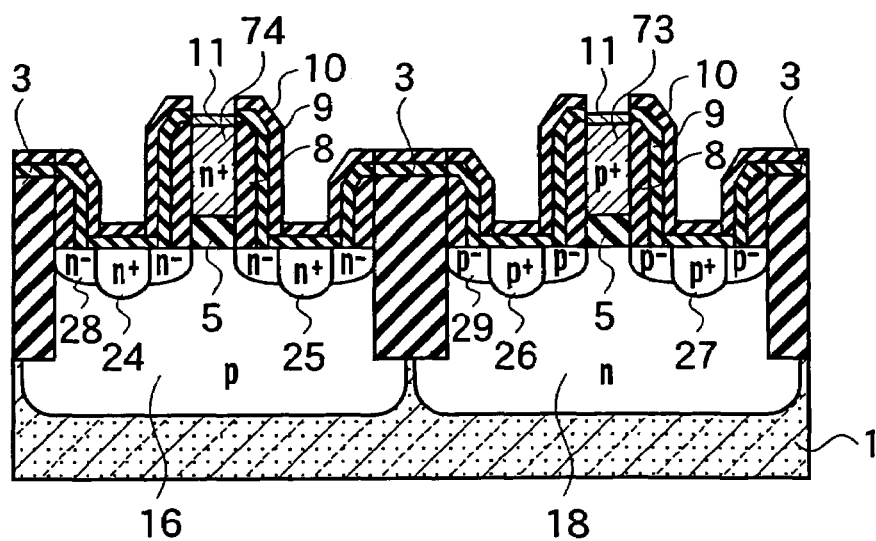
FIG. 7B is a schematic device cross-sectional diagram of a high voltage circuit for explaining a step of the nonvolatile semiconductor memory fabrication method according to the first embodiment of the present invention.
Figure 7C:
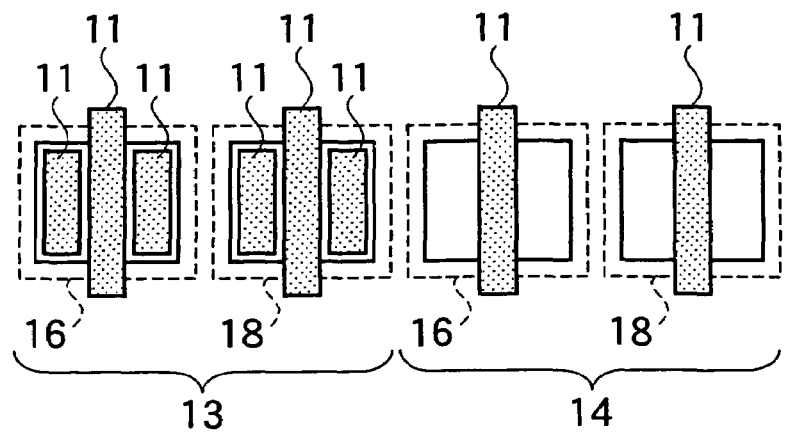
FIG. 7C is an aerial view of a corresponding schematic device pattern for explaining a step of the nonvolatile semiconductor memory fabrication method according to the first embodiment of the present invention.

As an alternative, as shown in FIG. 7B, the transistor structure in the high voltage circuit regions 14 in the nonvolatile semiconductor memory may have a structure that makes the second metallic salicide films 11 be electrically coupled with all of the first gate regions 74 and 73 of the nMOS transistor and the PMOS transistor.

Figure 8A:
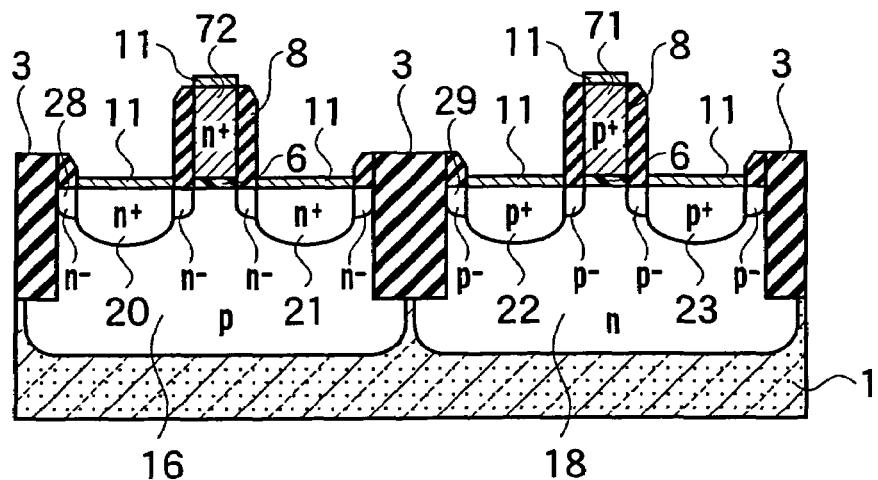
FIG. 8A is a schematic device cross-sectional diagram of a low voltage circuit for explaining a step of a nonvolatile semiconductor memory fabrication method according to the first embodiment of the present invention.
Figure 8B:
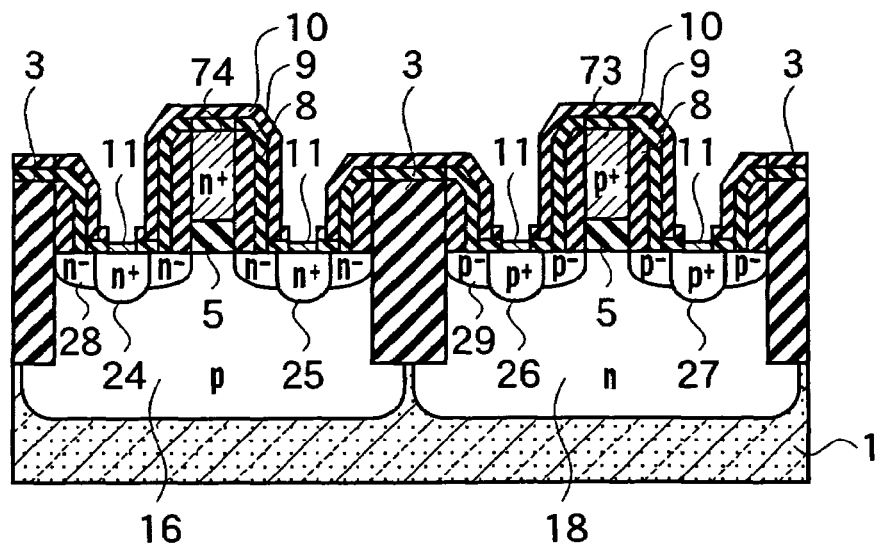
FIG. 8B is a schematic device cross-sectional diagram of a high voltage circuit for explaining a step of the nonvolatile semiconductor memory fabrication method according to the first embodiment of the present invention.
Figure 8C:
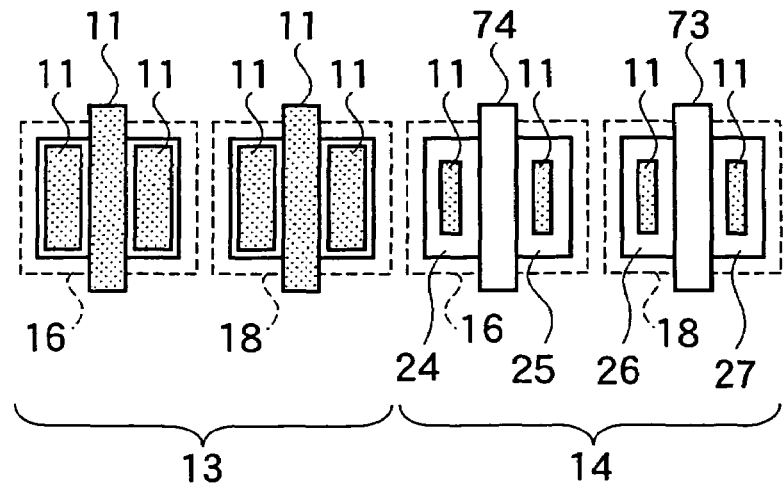
FIG. 8C is an aerial view of a corresponding schematic device pattern for explaining a step of the nonvolatile semiconductor memory fabrication method according to the first embodiment of the present invention.

As a further alternative, as shown in FIG. 8B, the transistor structure in the high voltage circuit regions 14 in the nonvolatile semiconductor memory may have a structure that electrically couples the second metallic salicide films 11 with all of the source/drain regions 24, 25, 26 and 27 of the nMOS transistor and the pMOS transistor.

Figure 9A:
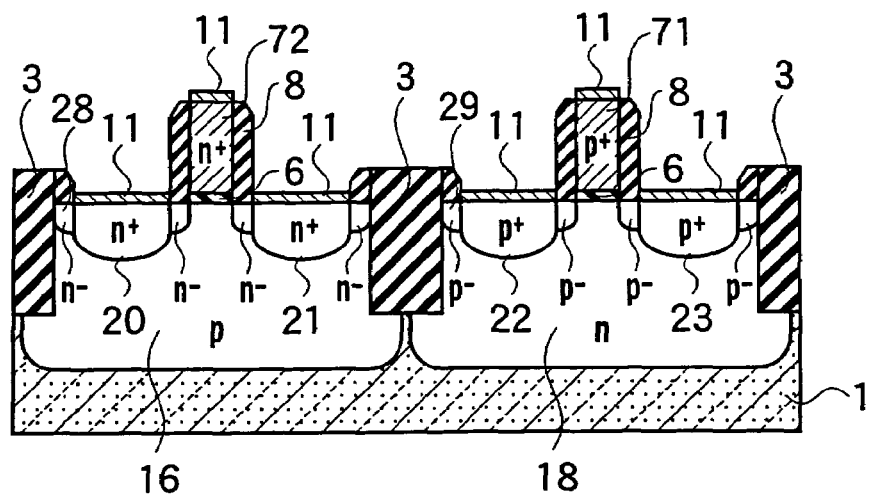
FIG. 9A is a schematic device cross-sectional diagram of a low voltage circuit for explaining a step of a nonvolatile semiconductor memory fabrication method according to the first embodiment of the present invention.
Figure 9B:
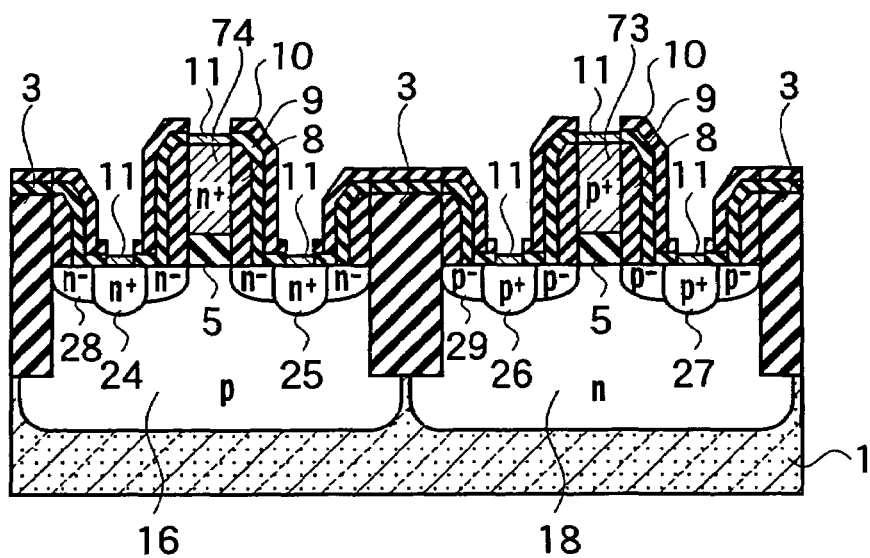
FIG. 9B is a schematic device cross-sectional diagram of a high voltage circuit for explaining a step of the nonvolatile semiconductor memory fabrication method according to the first embodiment of the present invention.
Figure 9C:
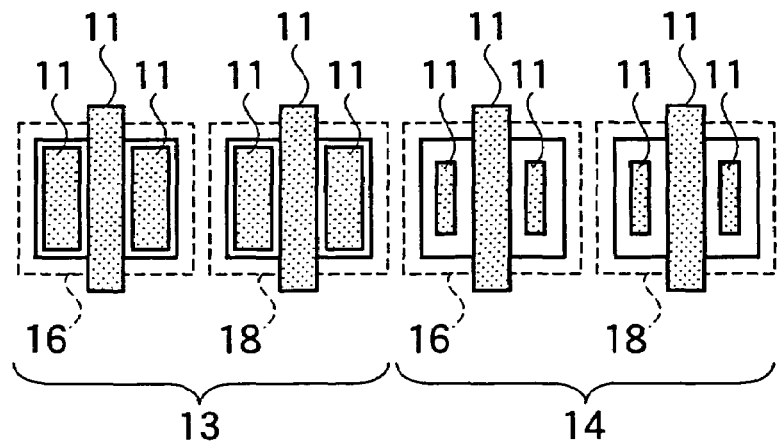
FIG. 9C is an aerial view of a corresponding schematic device pattern for explaining a step of the nonvolatile semiconductor memory fabrication method according to the first embodiment of the present invention.

As an even further alternative, as shown in FIG. 9B, the transistor structure in the high voltage circuit regions 14 in the nonvolatile semiconductor memory may have a structure that electrically couples the second metallic salicide films 11 with all of the source/drain regions 24, 25, 26 and 27 and the first gate regions 74 and 73 of the nMOS transistor and the pMOS transistor.

A detailed structure of the nMOS transistor in the high voltage circuit region 14 of the nonvolatile semiconductor memory according to the first embodiment of the present invention includes, as shown in FIG. 6B for example, the semiconductor substrate 1, the device isolation regions 3, the p-well region 16 formed in the semiconductor substrate 1, second insulating films 5, which become gate insulating films, an n⁺ polysilicon gate electrode 74, which becomes a first gate region arranged on the second insulating films 5, the n⁺ source/drain regions 24 and 25, which provides first source/drain regions, the n⁻ layers 28, which work as electric field relaxation layers arranged adjacent to the n⁺ source/drain regions 24 and 25, the fourth insulating films 8, which are arranged on the sidewalls of the n⁺ polysilicon gate electrode 74, and a fifth insulating film 9 and a sixth insulating film 10, which are deposited upon the n⁺ source/drain regions 24 and 25 and the n⁺ polysilicon gate electrode 74. Note that the fifth insulating film 9 and the sixth insulating film 10 may be formed as a single insulating film. As an alternative, as shown in FIG. 7B, the transistor structure in the high voltage circuit regions 14 in the nonvolatile semiconductor memory may have a structure that electrically couples the second metallic salicide films 11 with the n⁺ polysilicon gate electrode 74 of the nMOS transistor. As a further alternative, as shown in FIG. 8B, the transistor structure in the high voltage circuit regions 14 in the nonvolatile semiconductor memory may have a structure that electrically couples the second metallic salicide films 11 with the n⁺ source/drain regions 24 and 25 of the nMOS transistor. As an even further alternative, as shown in FIG. 9B, the transistor structure in the high voltage circuit regions 14 in the nonvolatile semiconductor memory may have a structure that electrically couples the second metallic salicide films 11 with all of the n⁺ source/drain regions 24 and 25 and the n⁺ polysilicon gate electrode 74 of the nMOS transistor.

A detailed structure of the PMOS transistor in the high voltage circuit region 14 of the nonvolatile semiconductor memory according to the first embodiment of the present invention includes, as shown in FIG. 6B for example, the semiconductor substrate 1, the device isolation regions 3, the n-well region 18 formed in the semiconductor substrate 1, the second insulating films 5, which provides gate insulating films, a p⁺ polysilicon gate electrode 73, which provides a first gate region arranged on the second insulating films 5, p⁺ source/drain regions 26 and 27, which provides first source/drain regions, p⁻ layers 29, which work as electric field relaxation layers arranged adjacent to the p⁺ source/drain regions 26 and 27, fourth insulating films 8, which are arranged on the sidewalls of the p⁺ polysilicon gate electrode 73, and a fifth insulating film 9 and a sixth insulating film 10, which are deposited on the p⁺ source/drain regions 26 and 27 and the p⁺ polysilicon gate electrode 73. Note that the fifth insulating film 9 and the sixth insulating film 10 may be formed as a single insulating film. As an alternative, as shown in FIG. 7B, the transistor structure in the high voltage circuit regions 14 in the nonvolatile semiconductor memory may have a structure that electrically couples the second metallic salicide films 11 with the p+ polysilicon gate electrode 73 of the pMOS transistor. As a further alternative, as shown in FIG. 8B, the transistor structure in the high voltage circuit regions 14 in the nonvolatile semiconductor memory may have a structure that electrically couples the second metallic salicide films 11 with the p+ source/drain regions 26 and 27 of the pMOS transistor. As an even further alternative, as shown in FIG. 9B, the transistor structure in the high voltage circuit regions 14 in the nonvolatile semiconductor memory may have a structure that electrically couples the second metallic salicide films 11 with all of the p+ source/drain regions 26 and 27 and the p+ polysilicon gate electrode 73 of the pMOS transistor.

(Fabrication Method)

A fabrication method for the nonvolatile semiconductor memory according to the first embodiment of the present invention is described using FIGS. 2 through 9. Steps of the process are set forth below in a given order. However, not all steps are limited to being performed in the stated order.

The structure after the device isolation regions 3 in the transistors of the low voltage circuit region 13 and the high voltage circuit region 14, respectively, are formed immediately after having deposited the first electrode films 4, which become floating gate material for memory cell transistors, is shown in FIGS. 2A through 2D.

Next, using lithography and etching techniques, in the high voltage circuit region 14, after having removed the seventh insulating film 12, which becomes a memory cell transistor inter-layer insulating film, the first electrode films 4, which become memory cell transistor floating gate electrode material, and the first insulating films 2, which are memory cell transistor tunnel oxide films, the second insulating films 5, which become transistor gate oxides in the high voltage circuit region 14, are formed; and in the low voltage circuit region 13, after having removed the seventh insulating film 12, the first electrode films 4 and the first insulating films 2, the third insulating films 6, which become transistor gate oxides in the low voltage circuit region 13, are formed (FIGS. 3A through 3D).

Next, once the second electrode films 7, which become memory cell transistor control gates in the cell array region 120, and transistor gate electrodes in the low voltage peripheral circuit region 13 and transistor gate electrodes in the high voltage peripheral circuit region 14, are deposited, using lithography and etching techniques, the second electrode films 7 are then formed (FIGS. 4A through 4D).

Subsequently, the fourth electrode films 8 are deposited, the gate sidewall structures of the transistors in the low voltage circuit region 13 and the high voltage circuit region 14 are formed using selectively etching techniques, and the fifth insulating film 9 is then deposited across the entirety so as to form the structures of FIGS. 5A through 5D.

The fourth insulating film 8 and the fifth insulating film 9 are ones providing a sufficient etch selectivity relative to the first electrode film 4 and the second electrode film 7, and the fourth insulating film 8 is a salicide control film on the gate sidewall obtained at the time when having formed the metallic salicide films 11, which is hereinafter described. Furthermore, it is preferable that the fifth insulating film 9 is an insulating film allowing a sufficient selectivity relative to the fourth insulating film 8. Moreover, the second electrode film 7 is implanted with the same impurity as those for the diffused layers so that the p+ polysilicon gate electrodes 71 and 73 are formed for the pMOS transistors, and the n+ polysilicon gate electrodes 72 and 74 are formed for the nMOS transistors.

Next, the sixth insulating film 10, which becomes a metallic salicide control film, is deposited, and the fifth insulating film 9 and the sixth insulating film 10 of the low voltage circuit region 13 are then removed using lithography and etching techniques. Subsequently, through the metallic salicide process, the second electrode films 71 and 72 are formed in the low voltage circuit region 13, and the metallic salicide films 11 are formed on the diffused layers such as the n+ source/drain regions 20 and 21 and the p+ source/drain regions 22 and 23 (FIGS. 6A through 6D).

A silicide material such as cobalt (Co) nickel (Ni), titanium (Ti), tantalum (Ta) platinum (Pt), molybdenum (Mo), tungsten (W) or palladium (Pd) may be used as the material for forming the metallic salicide film.

It should be noted that the metallic salicide film 11 is not formed in the high voltage circuit region 14, which is covered by the fifth insulating film 9 and the sixth insulating film 10 (FIG. 6B) The sixth insulating film 10 is preferably an insulating film providing a sufficient selectivity relative to the fifth insulating film 9.

It should be noted that depending on the lithographic patterning described with the structure in FIG. 6, the metallic salicide film 11 may be formed only on the second electrode films 73 and 74 of the high voltage circuit region 14 (FIG. 7), only on a part of the n+ source/drain regions 20, 21, 24 and 25 and the p+ source/drain regions 22, 23, 26 and 27 (FIG. 8), or on the p+ polysilicon gate electrodes 71 and 73 and the n+ polysilicon gate electrodes 72 and 74, and a part of the n+ source/drain regions 20, 21, 24 and 25 and the p+ source/drain regions 22, 23, 26 and 27 (FIG. 9).

The structure of the high voltage circuit region 14 in FIGS. 6B through 9B is decided based on the withstand voltage of the transistors in the high voltage circuit region 14. Thereafter, that structure is subjected to a typical contact formation process and an interconnect formation process.

Figure 5A:
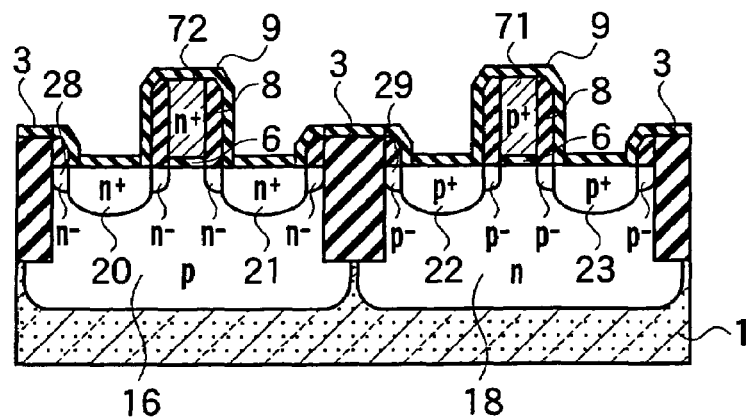
FIG. 5A is a schematic device cross-sectional diagram of a low voltage circuit for explaining a step of a nonvolatile semiconductor memory fabrication method according to the first embodiment of the present invention.
Figure 5B:
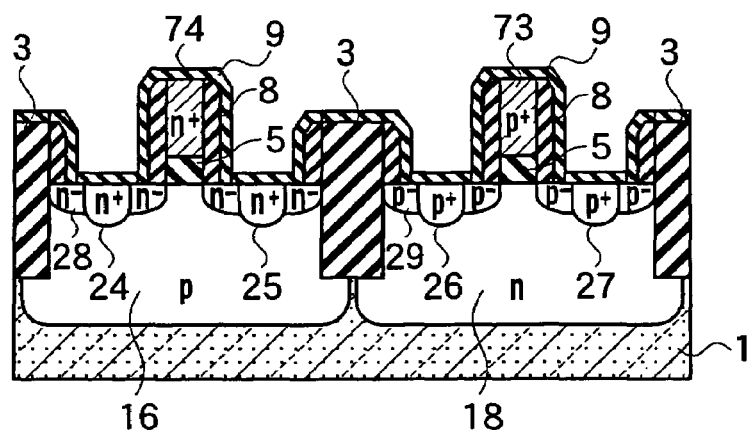
FIG. 5B is a schematic device cross-sectional diagram of a high voltage circuit for explaining a step of the nonvolatile semiconductor memory fabrication method according to the first embodiment of the present invention.
Figure 5C:
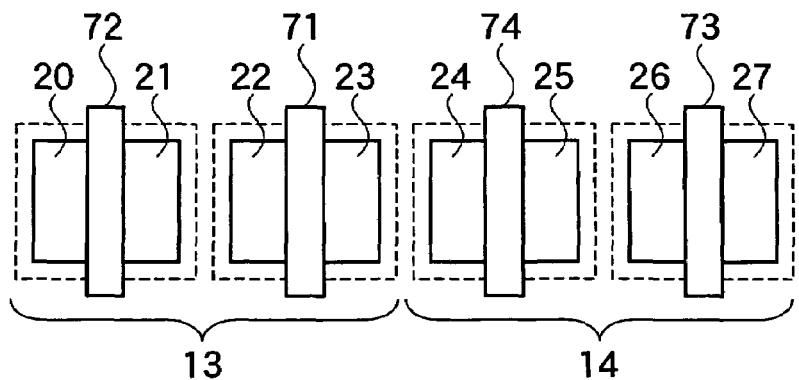
FIG. 5C is an aerial view of a corresponding schematic device pattern for explaining a step of the nonvolatile semiconductor memory fabrication method according to the first embodiment of the present invention.
Figure 5D:
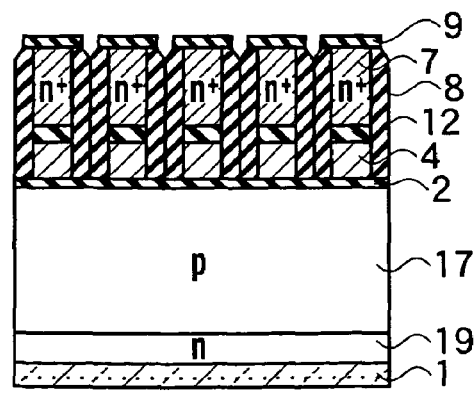
FIG. 5D is a schematic device cross-sectional diagram of a corresponding cell array region for explaining a step of the nonvolatile semiconductor memory fabrication method according to the first embodiment of the present invention.
Figure 6D:
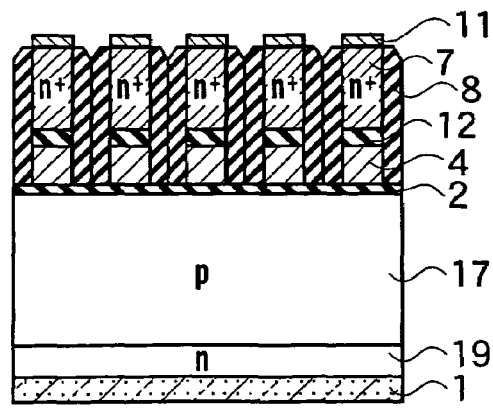
FIG. 6D is a schematic device cross-sectional diagram of a corresponding cell array region for explaining a step of the nonvolatile semiconductor memory fabrication method according to the first embodiment of the present invention.

Furthermore, in the cell regions of the cell array region 120 shown in FIG. 5D, the fourth insulating films 8 are filled in between the second electrode films 7 so that the fifth insulating films 9 and the sixth insulating films 10 in the cell regions can be removed as shown in FIG. 6D, and the metallic salicide films 11 can be selectively formed only on the second electrode films 7 (word lines).

Moreover, depending on the lithographic patterning besides the structure formed by the metallic salicide films 11 on the transistors in the low voltage circuit region 13 as shown in FIGS. 6A through 9A, the metallic salicide films 11 may be formed only on the second electrode films (word lines) 7 in the cell regions, allowing implementation of a structure specializing in low resistant second electrode films (word lines) 7.

The above nonvolatile semiconductor memory according to the first embodiment of the present invention and the fabrication process thereof allows provision of performance enhanced transistors in the low voltage circuit region 13, and highly integrated, high breakdown voltage transistors in the high voltage circuit region 14 at the same time.

Second Embodiment (Planar Pattern Block Structure)

The schematic block diagram of a nonvolatile semiconductor memory according to a second embodiment of the present invention includes, as shown in FIG. 1 for example, the cell array region 120, the high voltage circuit regions 90, the low voltage circuit regions 80, and the other circuit regions 100, which are a mixture of low voltage circuits, high voltage circuits and resistive element regions, arranged on the semiconductor chip 150. The following detailed configuration is the same as that of the first embodiment, thus description thereof is omitted.

(Device Structure)

The nonvolatile semiconductor memory according to the second embodiment of the present invention is fabricated as shown in FIGS. 10 through 14 by forming the cell array region 120 and the high voltage peripheral circuit regions 90 before formation of the device isolating regions 3 such as STIs, and then forming the low voltage peripheral circuit regions 80 through the subsequent fabrication process.

In FIGS. 10 through 14, FIGS. 10A through 14A represent a schematic device cross-sectional configuration of the low voltage circuit regions 80; FIGS; 10B through 14B represent a schematic device cross-sectional configuration of the high voltage circuit regions 90; and FIGS. 10C through 14C represent a schematic device cross-sectional configuration of the cell array region 120.

With the nonvolatile semiconductor memory according to the second embodiment of the present invention, the memory cell transistors and transistors in the high voltage circuit regions 90 all have a stacked gate structure; however, the transistors in the low voltage circuit regions 80 have a single-layered gate structure.

(Memory Cell Transistor Structure)

The memory cell transistor in the nonvolatile semiconductor memory according to the second embodiment of the present invention, as shown in FIGS. 10C through 14C, has a stacked gate structure as a basic structure configured with the first electrode film 4, which becomes floating gate electrodes, the seventh insulating film 12, which becomes inter-layer insulating films, and the second electrode films 7, which become first control gate electrodes; wherein the first metallic salicide films 11 are electrically coupled with the second electrode films 7. The structure of each part is the same as that of the memory cell transistor of the first embodiment, thus description thereof is omitted.

(Transistor Structure in Low Voltage Circuit Region)

The transistor structure of the low voltage circuit regions 80 in the nonvolatile semiconductor memory according to the second embodiment of the present invention is a structure, as shown in FIGS. 10A through 14A, configured with the third metallic salicide films 11 being electrically coupled with all of the first source/drain regions 20, 21, 22 and 23 and the first gate regions 72 and 71 of the nMOS transistor and the pMOS transistor. The structure of each part is the same as the transistor structure of the low voltage circuit regions of the first embodiment, thus description thereof is omitted.

(Transistor Structure in High Voltage Circuit Region)

The high voltage circuit region 90 includes, as shown in FIGS. 10B through 14B, for example, the p-well region 16 and the n-well region 18 formed in the semiconductor substrate 1, the nMOS transistor formed within the p-well region 16, and the pMOS transistor formed within the n-well region 18.

Figure 14A:
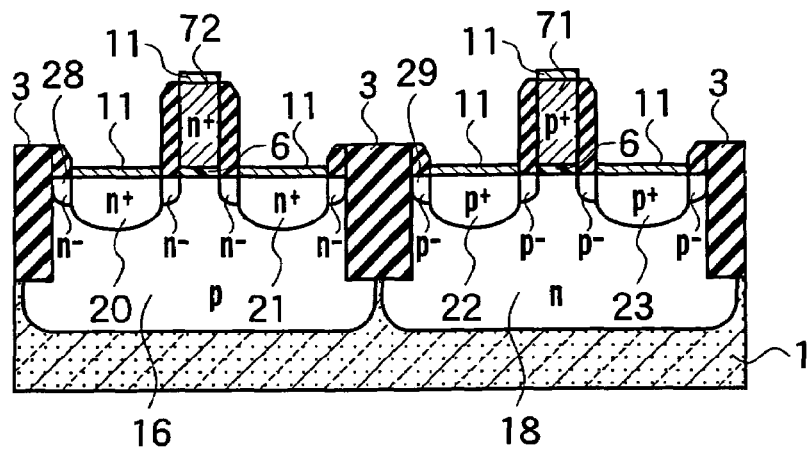
FIG. 14A is a schematic device cross-sectional diagram of a low voltage circuit for explaining a step of a nonvolatile semiconductor memory fabrication method according to the second embodiment of the present invention.
Figure 14B:
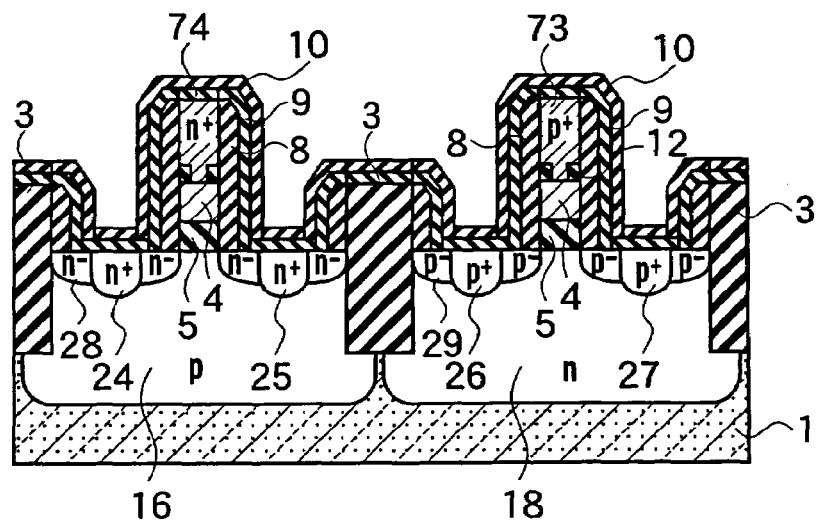
FIG. 14B is a schematic device cross-sectional diagram of a high voltage circuit for explaining a step of the nonvolatile semiconductor memory fabrication method according to the second embodiment of the present invention.

The transistor structure of the high voltage circuit regions 90 in the nonvolatile semiconductor memory according to the second embodiment of the present invention has a gate structure of the nMOS transistor and the pMOS transistor as shown in FIG. 14B. In other words, that gate structure is the same stacked gate structure as that of the memory cell transistor structure. The stacked gate structure comprises a stacked structure made up of the first electrode films 4, which become first gate regions, and the second electrode films 74 and 73, which become second control gate electrodes coupled with the first electrode films 4. In order to implement respective gate electrodes of the nMOS transistor and the pMOS transistor as a stacked structure, the transistor structure of the high voltage circuit regions 90 in the nonvolatile semiconductor memory has a structure with the second electrode films 74 and 73 being electrically coupled with the first electrode films 4 in the opening portion for the seventh insulating films 7 deposited upon the first electrode films 4. Note that the seventh insulating films 12 may be completely removed from the gate regions to form a perfect stacked structure.

The structure shown in FIG. 14B, as with the structure in FIG. 6B, has a structure with the second electrode films 74 and 73 being electrically insulated from the second metallic salicide films 11 or not being electrically coupled therewith. As an alternative, as shown in FIG. 7B, the transistor structure of the high voltage circuit regions 90 in the nonvolatile semiconductor memory may have a structure that electrically couples the second metallic salicide films 11 with both of the second electrode films 74 and 73 of the nMOS transistor and the pMOS transistor. As a further alternative, as shown in FIG. 8B, the transistor structure in the high voltage circuit regions 90 in the nonvolatile semiconductor memory may have a structure that electrically couples the second metallic salicide films 11 with a part of the first source/drain regions 24 and 25 of the nMOS transistor and the first source/drain regions 26 and 27 of the pMOS transistor. As a further alternative, as shown in FIG. 9B, the transistor structure in the high voltage circuit regions 90 in the nonvolatile semiconductor memory may have a structure that electrically couples the second metallic salicide films 11 with all of the first source/drain regions 24 and 25 of the nMOS transistor, the first source/drain regions 26 and 27 of the pMOS transistor, and the second electrode films 74 and 73.

A detailed structure of the nMOS transistor in the high voltage circuit region 90 of the nonvolatile semiconductor memory according to the second embodiment of the present invention includes, for example, as shown in FIG. 14B, the semiconductor substrate 1, the device isolation regions 3, the p-well region 16 formed in the semiconductor substrate 1, second insulating films 5, which become gate insulating films, the first electrode films 4, which are arranged on the second insulating films 5, the seventh insulating films 12, which are deposited upon the first electrode films 4, the $n^+$ polysilicon gate electrode 74, which is electrically coupled with the seventh insulating films 12 via the openings formed therein, the $n^+$ source/drain regions 24 and 25, the $n^-$ layers 28, which work as electric field relaxation layers arranged adjacent to the $n^+$ source/drain regions 24 and 25, the fourth insulating films 8, which are arranged on the sidewalls in the stacked gate structure made of the first electrode films 4 and the $n^+$ polysilicon gate electrode 74, and the fifth insulating film 9 and the sixth insulating film 10, which are deposited upon the $n^+$ source/drain regions 24 and 25 and the $n^+$ polysilicon gate electrode 74. Note that the fifth insulating film 9 and the sixth insulating film 10 may be formed as a single insulating film. As an alternative, as shown in FIG. 7B, the transistor structure in the high voltage circuit regions 90 in the nonvolatile semiconductor memory may have a structure that electrically couples the metallic salicide films 11 with the $n^+$ polysilicon gate electrode 74 of the nMOS transistor. As a further alternative, as shown in FIG. 8B, the transistor structure in the high voltage circuit regions 90 in the nonvolatile semiconductor memory may have a structure that electrically couples the metallic salicide films 11 with a part of the $n^+$ source/drain regions 24 and 25 of the nMOS transistor. As an even further alternative, as shown in FIG. 9B, the transistor structure in the high voltage circuit regions 90 in the nonvolatile semiconductor memory may have a structure that electrically couples the second metallic salicide films 11 with the n+ polysilicon gate electrode 74 and a part of the n+ source/drain regions 24 and 25 of the nMOS transistor.

A detailed structure of the pMOS transistor in the high voltage circuit region 90 of the nonvolatile semiconductor memory according to the second embodiment of the present invention includes, for example, as shown in FIG. 14B, the semiconductor substrate 1, the device isolation regions 3, the p-well region 18 formed in the semiconductor substrate 1, second insulating films 5, which become gate insulating films, the first electrode films 4, which are arranged on the second insulating films 5, the seventh insulating films 12, which are deposited on the first electrode films 4, the p+ polysilicon gate electrode 73, which is electrically coupled with the seventh insulating films 12 via the openings formed therein, the p+ source/drain regions 26 and 27, the p− layers 29, which work as electric field relaxation layers arranged adjacent to the p+ source/drain regions 26 and 27, the fourth insulating films 8, which are arranged on the sidewalls in the stacked gate structure made of the first electrode films 4 and the p+ polysilicon gate electrode 73, and the fifth insulating film 9 and the sixth insulating film 10, which are deposited upon the p+ source/drain regions 26 and 27 and the p+ polysilicon gate electrode 73. Note that the fifth insulating film 9 and the sixth insulating film 10 may be formed as a single insulating film. As an alternative, as shown in FIG. 7B, the transistor structure in the high voltage circuit regions 90 in the nonvolatile semiconductor memory it may have a structure that electrically couples the metallic salicide films 11 with the p+ polysilicon gate electrode 73 of the pMOS transistor. As a further alternative, as shown in FIG. 8B, the transistor structure in the high voltage circuit regions 90 in the nonvolatile semiconductor memory may have a structure that electrically couples the metallic salicide films 11 with a part of the p+ source/drain regions 26 and 27 of the pMOS transistor. As an even further alternative, as electrically couples in FIG. 9B, the transistor structure in the high voltage circuit regions 90 in the nonvolatile semiconductor memory may have a structure that makes the metallic salicide films 11 with all of the p+ source/drain regions 26 and 27 and the p+ polysilicon gate electrode 73 of the pMOS transistor.

(Fabrication Method)

A fabrication method for the nonvolatile semiconductor memory according to the second embodiment of the present invention is described using FIGS. 10 through 14. Steps of the process are set forth below in a given order. However, not all steps are limited to being performed in the stated order.

Figure 10A:
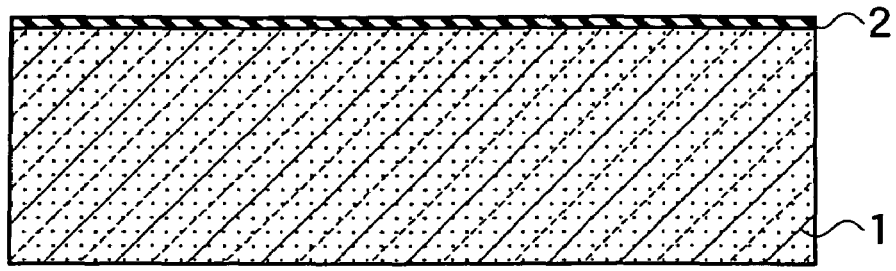
FIG. 10A is a schematic device cross-sectional diagram of a low voltage circuit for explaining a step of a nonvolatile semiconductor memory fabrication method according to the second embodiment of the present invention.
Figure 10B:
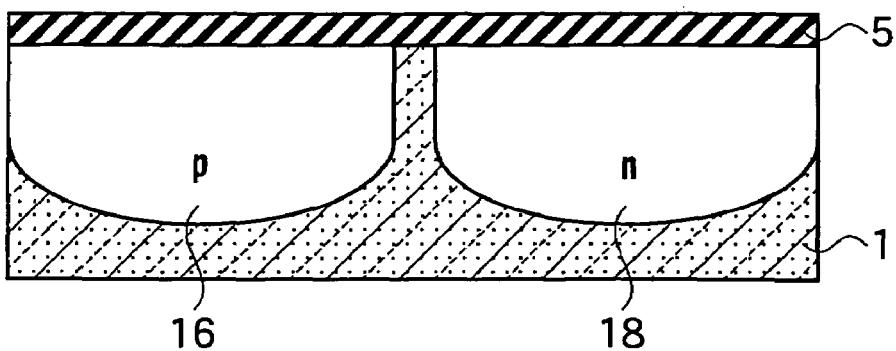
FIG. 10B is a schematic device cross-sectional diagram of a high voltage circuit for explaining a step of the nonvolatile semiconductor memory fabrication method according to the second embodiment of the present invention.
Figure 10C:
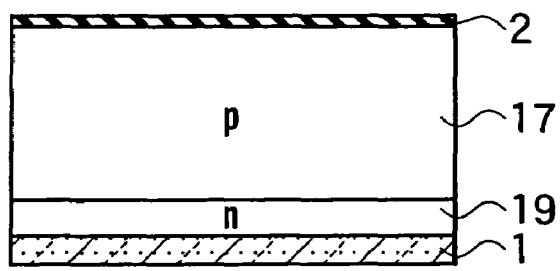
FIG. 10C is a schematic device cross-sectional diagram in a corresponding cell array region for explaining a step of the nonvolatile semiconductor memory fabrication method according to the second embodiment of the present invention.
Figure 11A:
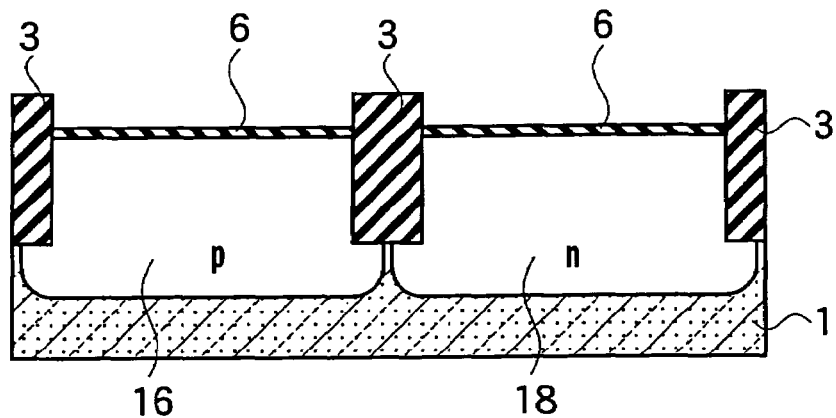
FIG. 11A is a schematic device cross-sectional diagram of a low voltage circuit for explaining a step of a nonvolatile semiconductor memory fabrication method according to the second embodiment of the present invention.
Figure 11B:
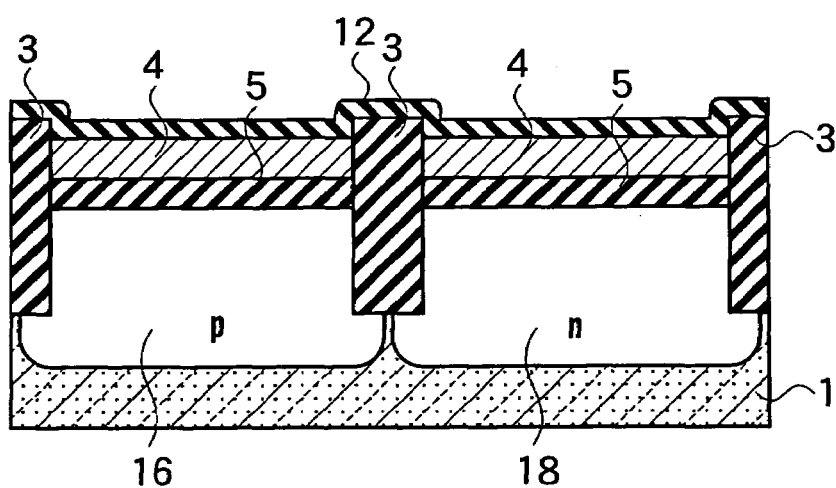
FIG. 11B is a schematic device cross-sectional diagram of a high voltage circuit for explaining a step of the nonvolatile semiconductor memory fabrication method according to the second embodiment of the present invention.
Figure 11C:
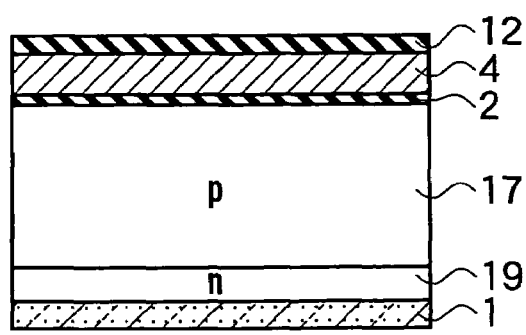
FIG. 11C is a schematic device cross-sectional diagram of a corresponding cell array region for explaining a step of the nonvolatile semiconductor memory fabrication method according to the second embodiment of the present invention.

FIGS. 10A through 10C represent a structure with the second insulating film 5, which is formed and becomes gate insulating films for the transistors in the high voltage circuit regions 90, the first insulating film 2, which is formed as a tunnel oxide film in the memory cell transistor of the cell array region 120, and transistors formed in the low voltage circuit regions 80 at the same time.

Next, once the first electrode film 4, which becomes floating gates in the memory cell transistor, is deposited, the device isolating regions 3 are formed, and the seventh insulating film 12, which becomes inter-layer insulating films in the memory cell transistor, are deposited. Subsequently, as in FIGS. 2 and 3, in the low voltage circuit regions 80, the seventh insulating film 12, the first electrode film 4 and the first insulating film 2 are removed so as to form the third insulating films 6, which become transistor gate oxides in the low voltage circuit regions 80, using lithography and etching techniques.

Figure 12A:
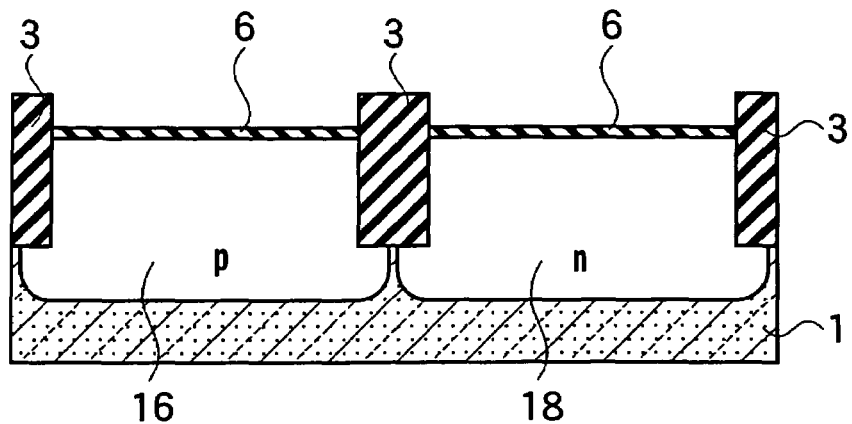
FIG. 12A is a schematic device cross-sectional diagram of a low voltage circuit for explaining a step of a nonvolatile semiconductor memory fabrication method according to the second embodiment of the present invention.
Figure 12B:
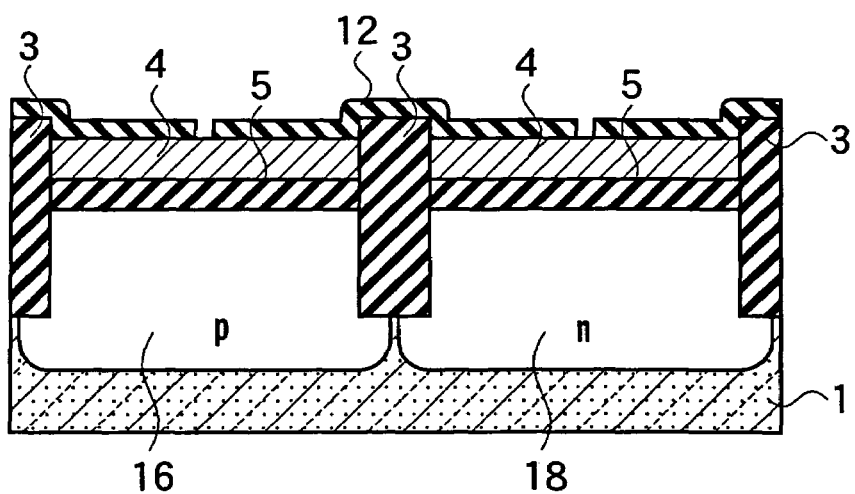
FIG. 12B is a schematic device cross-sectional diagram of a high voltage circuit for explaining a step of the nonvolatile semiconductor memory fabrication method according to the second embodiment of the present invention.
Figure 12C:
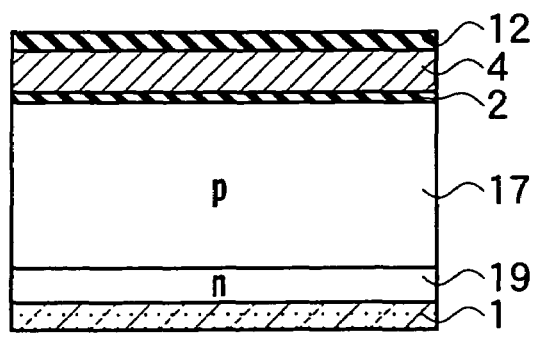
FIG. 12C is a schematic device cross-sectional diagram of a corresponding cell array region for explaining a step of the nonvolatile semiconductor memory fabrication method according to the second embodiment of the present invention.

Next, in the high voltage circuit regions 90, in order to electrically connect the control gates of the transistors in the memory cell transistors to be formed in the steps shown in FIG. 13 to the second electrode films 7 and the first electrode film 4, which become transistor gate electrodes in the high voltage peripheral circuit regions 90 and the low voltage peripheral circuit regions 80, respectively, a part or all of the seventh insulating film 12 is removed from the gate regions of the transistors in the high voltage circuit regions 90 (FIGS. 12A through 12C).

Figure 13A:
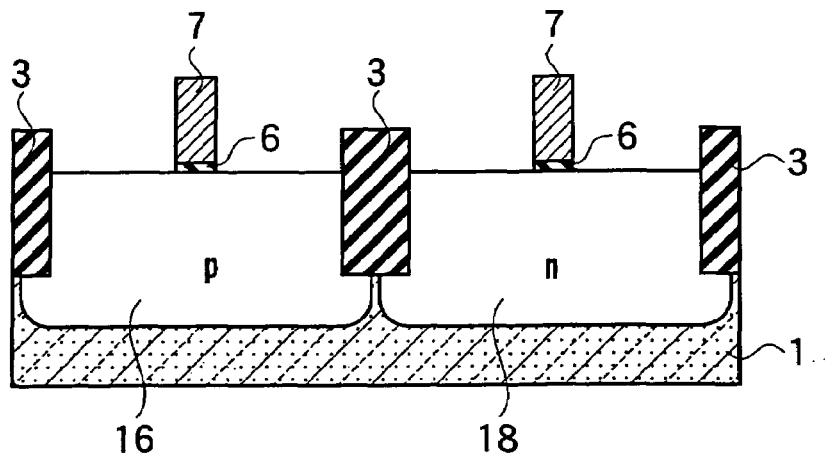
FIG. 13A is a schematic device cross-sectional diagram of a low voltage circuit for explaining a step of a nonvolatile semiconductor memory fabrication method according to the second embodiment of the present invention.
Figure 13B:
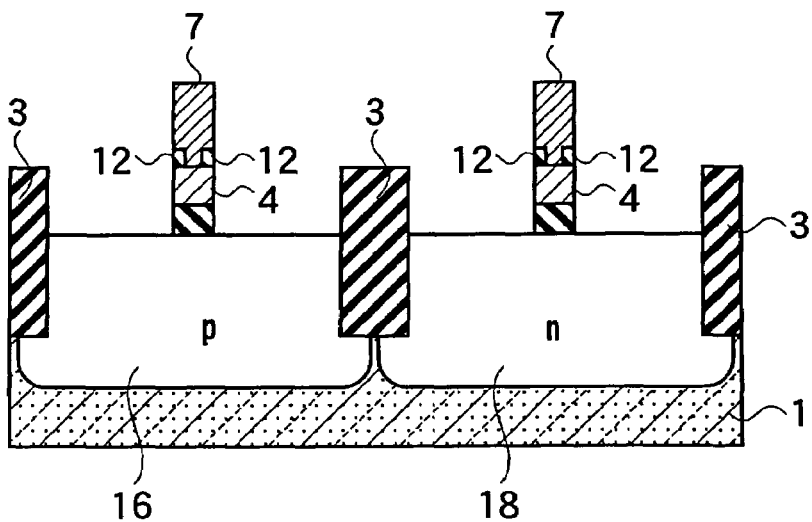
FIG. 13B is a schematic device cross-sectional diagram of a high voltage circuit for explaining a step of the nonvolatile semiconductor memory fabrication method according to the second embodiment of the present invention.
Figure 13C:
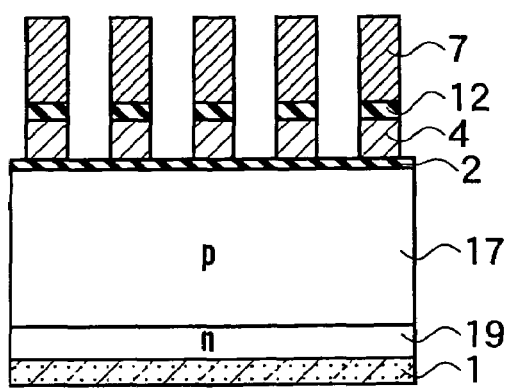
FIG. 13C is a schematic device cross-sectional diagram of a corresponding cell array for explaining a step of the nonvolatile semiconductor memory fabrication method according to the second embodiment of the present invention.

The second electrode films 7 are then deposited so as to form the second electrode films 7 in the same manner as in FIG. 4 (FIGS. 13A through 13C).

Subsequently, as in FIGS. 5 through 9, the metallic salicide films 11 are selectively formed (FIG. 14 has the same structure as FIG. 6).

In addition, the second electrode films 71 and 72 of the transistors in the low voltage circuit regions 80 at this time are implanted with the same impurity as that for the diffused layers so that the p+ polysilicon gate electrode 71 is formed in the p-type transistor and the n+ polysilicon gate electrode 72 is formed in the n-type transistor. The p+ polysilicon gate electrode 73 and the n+ polysilicon gate electrode 74, which become transistor gate electrodes in the high voltage circuit regions 90, are electrically connected to the floating gate electrode material (n-type) 4, therefore a mixture of p-type and n-type impurities exists in the p-type transistor. However, through a subsequent thermal process, both impurities are sufficiently diffused, and due to the volume ratio of the floating gate electrode material 4 to p+ polysilicon gate electrode 73, a p-type gate is finally formed.

For the n-type transistor, an n-type gate is finally formed as with the transistors in the low voltage circuit regions 80. Furthermore, as described with FIG. 6D in the first embodiment of the present invention, forming the metallic salicide films 11 only on the second electrode films 7 (word lines) in the cell regions is possible.

The above fabrication process for the nonvolatile semiconductor memory according to the second embodiment of the present invention allows concurrent implementation of enhanced transistors in the low voltage circuit regions 80, and highly integrated, high breakdown voltage transistors in the high voltage circuit regions 90.

Third Embodiment (Planar Pattern Block Structure)

The schematic block diagram of a nonvolatile semiconductor memory according to a third embodiment of the present invention includes, for example, as shown in FIG. 1, the cell array region 120, the high voltage circuit regions 90, the low voltage circuit regions 80, and the other circuit regions 100, which are a mixture of low voltage circuits, high voltage circuits and resistive element regions, arranged on the semiconductor chip 150. The following detailed configuration is the same as that of the first embodiment, thus description thereof is omitted.

(Device Structure)

Figure 15A:
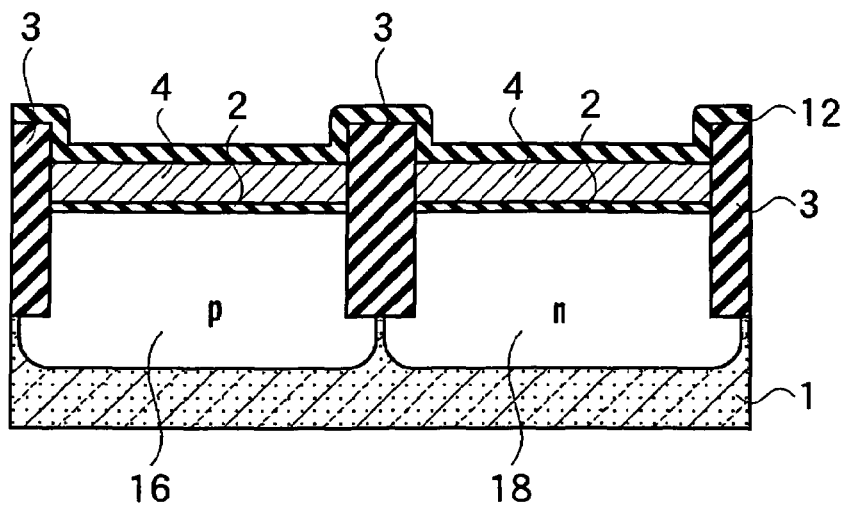
FIG. 15A is a schematic device cross-sectional diagram of a low voltage circuit for explaining a step of a nonvolatile semiconductor memory fabrication method according to the third embodiment of the present invention.
Figure 15B:
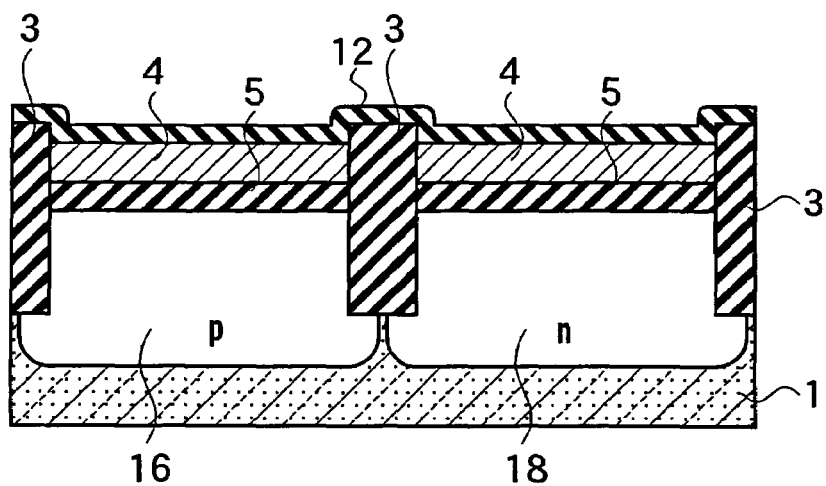
FIG. 15B is a schematic device cross-sectional diagram of a high voltage circuit for explaining a step of the nonvolatile semiconductor memory fabrication method according to the third embodiment of the present invention.
Figure 15C:
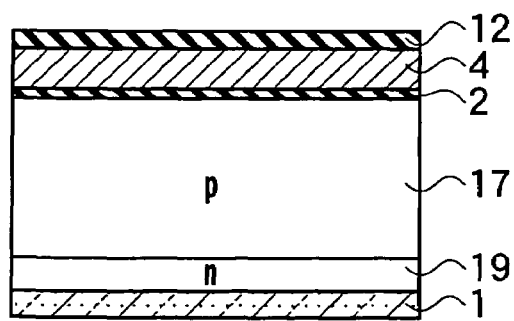
FIG. 15C is a schematic device cross-sectional diagram in a corresponding cell array for explaining a step of the nonvolatile semiconductor memory fabrication method according to the third embodiment of the present invention.
Figure 16A:
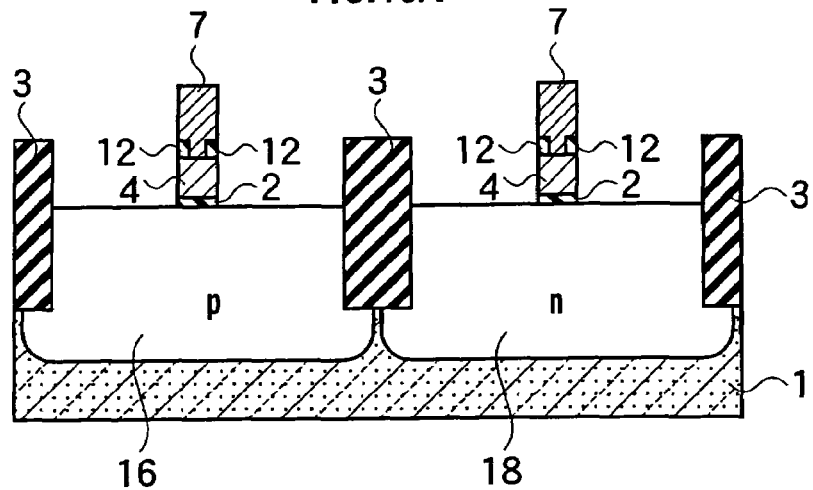
FIG. 16A is a schematic device cross-sectional diagram of a low voltage circuit for explaining a step of the nonvolatile semiconductor memory fabrication method according to the third embodiment of the present invention.
Figure 16B:
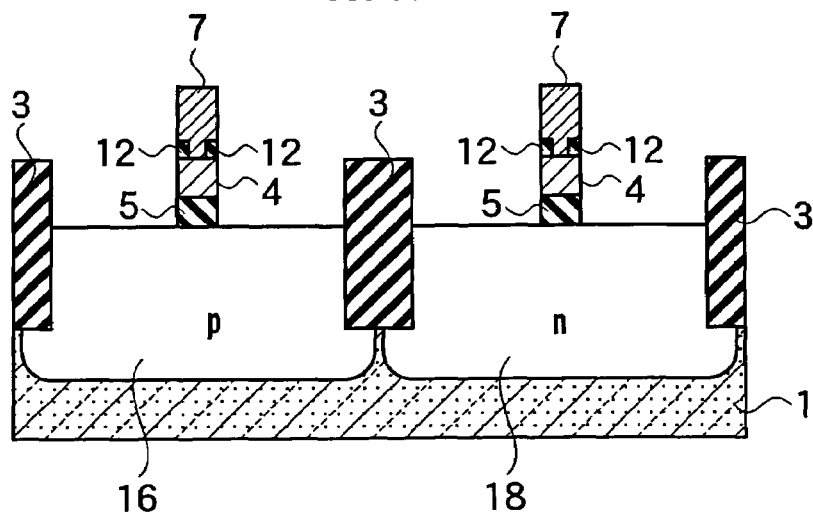
FIG. 16B is a schematic device cross-sectional diagram of a high voltage circuit for explaining a step of the nonvolatile semiconductor memory fabrication method according to the third embodiment of the present invention.
Figure 16C:
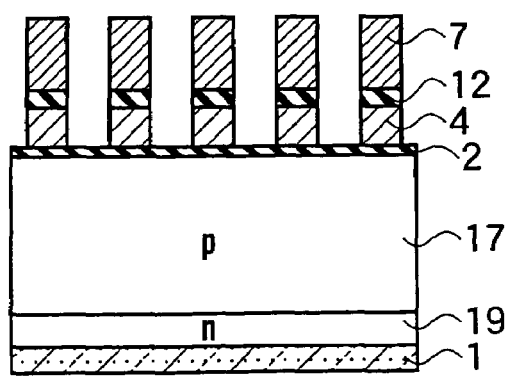
FIG. 16C is a schematic device cross-sectional diagram of a corresponding cell array region for explaining a step of the nonvolatile semiconductor memory fabrication method according to the third embodiment of the present invention.
Figure 17A:
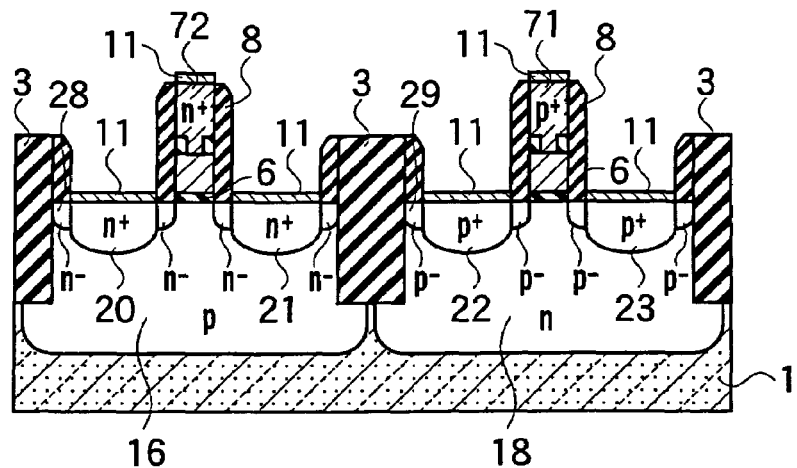
FIG. 17A is a schematic device cross-sectional diagram of a low voltage circuit for explaining a step of the nonvolatile semiconductor memory fabrication method according to the third embodiment of the present invention.

The nonvolatile semiconductor memory according to the third embodiment of the present invention is fabricated as shown in FIGS. 15 through 17 by forming the cell array region 120, and the high voltage peripheral circuit regions 90 and the low voltage peripheral circuit regions 80 before formation of the device isolating regions 3 such as STIs. In FIGS. 15 through 17, FIGS. 15A through 17A represent schematic device cross-sectional configurations of the low voltage circuit regions 80; 15B through 17B represent schematic device cross-sectional configurations of the high voltage circuit regions 90; and 15C through 17C represent schematic device cross-sectional configurations of the cell array region 120.

With the nonvolatile semiconductor memory according to the third embodiment of the present invention, the memory cell transistors and transistors in the high voltage circuit regions 90 and the low voltage circuit regions 80 all have a stacked gate structure.

(Memory Cell Transistor Structure)

The memory cell transistor in the nonvolatile semiconductor memory according to the third embodiment of the present invention, as shown in FIGS. 15A through 17C, has a stacked gate structure as a basic structure configured with the first electrode film 4, which becomes floating gate electrodes, the seventh insulating film 12, which becomes inter-layer insulating films, and the second electrode films 7, which become first control gate electrodes; wherein the first metallic salicide films 11 are electrically coupled with the second electrode films 7. The structure of each part is the same as that of the memory cell transistor of the first and the second embodiment, thus description thereof is omitted.

(Transistor Structure in Low Voltage Circuit Region)

The low voltage circuit region 80 includes, for example, as shown in FIGS. 15A through 17A, the p-well region 16 and the n-well region 18 formed in the semiconductor substrate 1, an nMOS transistor formed within the p-well region 16, and a PMOS transistor formed within the n-well region 18.

The transistors of the low voltage circuit regions 80 in the nonvolatile semiconductor memory according to the third embodiment of the present invention have a gate structure of the nMOS transistor and the pMOS transistor as shown in FIG. 17A. In other words, that gate structure is the same stacked gate structure as that of the memory cell transistor structure That stacked gate structure is a stacked structure made up of the first electrode films 4, which become second gate regions, and the second electrode films 72 and 71, which become third control gate electrodes in contact to the first electrode films 4. In order to implement respective gate structures of the nMOS transistor and the pMOS transistor as the stacked structure, it includes the second electrode films 72 and 71 electrically coupled with the first electrode films 4 in the opening portion for the seventh insulating films 12 deposited upon the first electrode films 4. Note that the seventh insulating films 12 may be completely removed from the gate regions to form a perfect stacked structure.

The structure shown in FIG. 17A, as with the structure shown in FIG. 6A or FIG. 14A, is one that electrically couples the metallic salicide films 11 with all of the source/drain regions 20, 21, 22 and 23 and the second gate regions 72 and 71 of the nMOS transistor and the pMOS transistor.

A detailed structure of the nMOS transistor in the low voltage circuit region 80 of the nonvolatile semiconductor memory according to the third embodiment of the present invention includes, for example, as shown in FIG. 17A, the semiconductor substrate 1, the device isolation regions 3, the p-well region 16 formed in the semiconductor substrate 1, third insulating films 6, which become gate insulating films, the first electrode films 4, which are arranged on the third insulating films 6, the seventh insulating films 12, which are deposited upon the first electrode films 4, the $n^+$ polysilicon gate electrode 72, which is electrically coupled with the seventh insulating films 12 via the openings formed therein, the $n^+$ source/drain regions 20 and 21, the $n^-$ layers 28, which work as electric field relaxation layers arranged adjacent to the $n^+$ source/drain regions 20 and 21, the fourth insulating films 8, which are arranged on the sidewalls in the stacked gate structure made of the first electrode films 4 and the $n^+$ polysilicon gate electrode 72, and the metallic salicide films 11, which are electrically coupled with and arranged upon the $n^+$ source/drain regions 20 and 21 and the $n^+$ polysilicon gate electrode 72.

A detailed structure of the pMOS transistor in the low voltage circuit region 80 of the nonvolatile semiconductor memory according to the third embodiment of the present invention includes, for example, as shown in FIG. 17A, the semiconductor substrate 1, the device isolation regions 3, the n-well region 18 formed in the semiconductor substrate 1, the third insulating films 6, which become gate insulating films, the first electrode films 4, which are arranged on the third insulating films 6, the seventh insulating films 12, which are deposited upon the first electrode films 4, the $p^+$ polysilicon gate electrode 71, which is electrically coupled with the seventh insulating films 12 via the openings formed therein, the $p^+$ source/drain regions 22 and 23, the $p^-$ layers 29, which work as electric field relaxation layers arranged adjacent to the $p^+$ source/drain regions 22 and 23, the fourth insulating films 8, which are arranged on the sidewalls in the stacked gate structure made of the first electrode films 4 and the $p^+$ polysilicon gate electrode 71, and the metallic salicide films 11, which are electrically coupled with and arranged upon the $p^+$ source/drain regions 22 and 23 and the $p^+$ polysilicon gate electrode 71.

(Transistor Structure in High Voltage Circuit Region)

The high voltage circuit region 90 includes, for example, as shown in FIGS. 15B through 17B, the p-well region 16 and the n-well region 18 formed in the semiconductor substrate 1, the nMOS transistor formed within the p-well region 16, and the pMOS transistor formed within the n-well region 18.

Figure 17B:
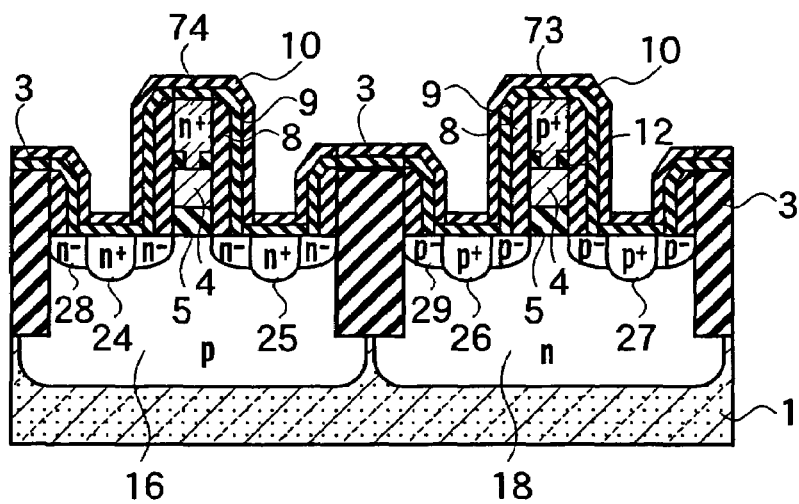
FIG. 17B is a schematic device cross-sectional diagram of a high voltage circuit for explaining a step of the nonvolatile semiconductor memory fabrication method according to the third embodiment of the present invention.
Figure 17C:
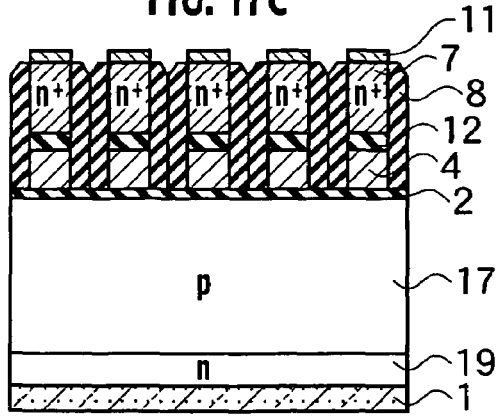
FIG. 17C is a schematic device cross-sectional diagram of a corresponding cell array region for explaining a step of the nonvolatile semiconductor memory fabrication method according to the third embodiment of the present invention.

The transistor structure of the high voltage circuit regions 90 in the nonvolatile semiconductor memory according to the third embodiment of the present invention has a gate structure of the nMOS transistor and the pMOS transistor as shown in FIG. 17B. In other words, that gate structure is the same stacked gate structure as that of the memory cell transistor structure. The stacked gate structure is one that is made up of the first electrode films 4, which become first gate regions, and the second electrode films 74 and 73, which become second control gate electrodes in contact to the first electrode films 4. In order to implement respective gate structures of the nMOS transistor and the pMOS transistor as a stacked structure, it includes the second electrode films 74 and 73 electrically coupled with the first electrode films 4 in the opening portion for the seventh insulating films 12 deposited upon the first electrode films 4. Note that the seventh insulating films 12 may be completely removed from the gate regions to form a perfect stacked structure. The structure of each part is the same as the transistor structure of the high voltage circuit regions of the second embodiment, thus description thereof is omitted.

(Fabrication Method)

A fabrication method for the nonvolatile semiconductor memory according to the third embodiment of the present invention is described using FIGS. 15 through 17. Steps of the process are set forth below in a given order. However, not all steps are limited to being performed in the stated order.

As with FIG. 10 and FIG. 11, FIGS. 15A through 15C show a structure obtained by forming the second insulating film 5, which becomes gate insulating films of the transistors in the high voltage circuit regions 90, forming the first insulating film 2 in the cell array region 120 and the low voltage circuit regions 80, which is a tunnel oxide film of the memory cell transistor, depositing the first electrode film 4, which becomes floating gates of the memory cell transistor, forming the device isolating regions 3, and depositing the seventh insulating film 12, which becomes inter-layer insulating films of the memory cell transistors.

Next, as in FIG. 12, a part or all of the seventh insulating film 12 is removed from the transistor gate regions in the low voltage circuit regions 80 in addition to the transistors in the high voltage circuit regions 90, so as to form the second electrode films 7 (FIGS. 16A through 16C) as in FIG. 13.

Subsequently, as in FIGS. 5 through 9 or FIG. 14, the metallic salicide films 11 are selectively formed (FIG. 17 has the same structure as FIG. 6 and FIG. 14).

Furthermore, the second electrode film 7 for the transistors in the low voltage circuit regions 80 and the high voltage circuit regions 90 at this time is implanted with the same impurity as that for the diffused layers so that the p$^+$ polysilicon gate electrodes 71 and 73 are formed for the p-type transistors, and the n$^+$ polysilicon gate electrodes 72 and 74 are formed for the n-type transistors. The p$^+$ polysilicon gate electrodes 71 and 73 and the n$^+$ polysilicon gate electrodes 72 and 74 are all electrically connected to the floating gate electrode material (n-type) 4.

Particularly, the p$^+$ polysilicon gate electrode 71 of the transistors in the low voltage circuit regions 80 and the p$^+$ polysilicon gate electrode 73 of the transistors in the high voltage circuit regions 90 are electrically connected to the floating gate electrode material (n-type) 4, therefore a mixture of p-type and n-type impurities exists. However, through a subsequent thermal process, both impurities are sufficiently diffused, and due to the volume ratio of the floating gate electrode material 4 to p$^+$ polysilicon gate electrodes 71 and 73 p-type gates are finally formed.

The n-type transistors have n$^+$ polysilicon gate electrodes 72 and 74 since the transistors in the low voltage circuit regions 80 and the high voltage circuit regions 90 end up having n-type gates.

Figure 14C:
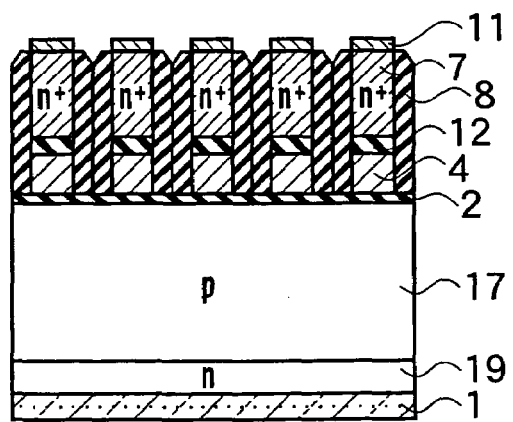
FIG. 14C is a schematic device cross-sectional diagram of a corresponding cell array region for explaining a step of the nonvolatile semiconductor memory fabrication method according to the second embodiment of the present invention.

Furthermore, as described with FIG. 6D in the first embodiment and FIG. 14C in the second embodiment of the present invention, forming the metallic salicide films 11 only on the second electrode films 7 (word lines) in the cell regions is possible.

The above fabrication process for the nonvolatile semiconductor memory according to the third embodiment of the present invention allows concurrent implementation of enhanced transistors in the low voltage circuit regions 80, and highly integrated, high breakdown voltage transistors in the high voltage circuit regions 90.

Fourth Embodiment

Figure 18A:
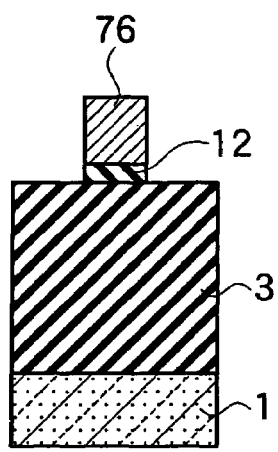
FIG. 18A is a schematic device cross-sectional diagram of a resistive element for explaining a step of a nonvolatile semiconductor memory fabrication method according to the fourth embodiment of the present invention.
Figure 18B:
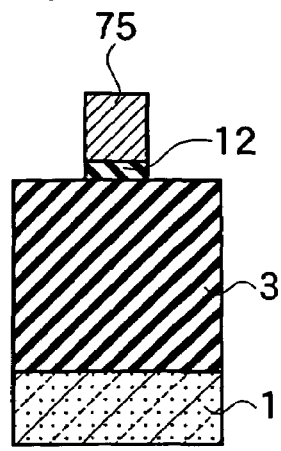
FIG. 18B is a schematic device cross-sectional diagram of an interconnect region for explaining a step of the nonvolatile semiconductor memory fabrication method according to the fourth embodiment of the present invention.
Figure 19A:
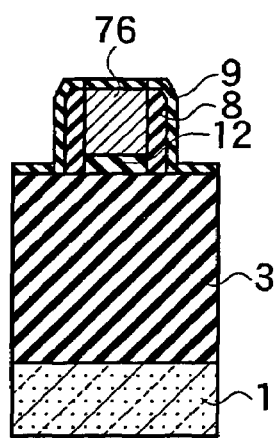
FIG. 19A is a schematic device cross-sectional diagram of a resistive element for explaining a step of a nonvolatile semiconductor memory fabrication method according to the fourth embodiment of the present invention.
Figure 19B:
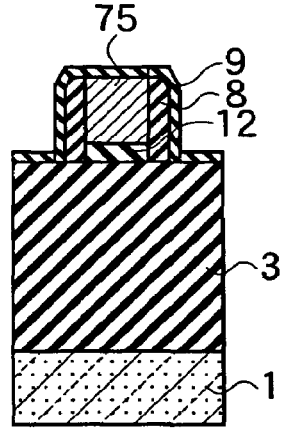
FIG. 19B is a schematic device cross-sectional diagram of an interconnect region for explaining a step of the nonvolatile semiconductor memory fabrication method according to the fourth embodiment of the present invention.
Figure 20A:
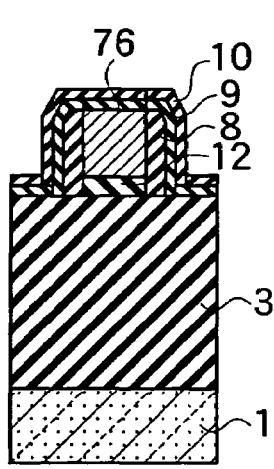
FIG. 20A is a schematic device cross-sectional diagram of a resistive element for explaining a step of a nonvolatile semiconductor memory fabrication method according to the fourth embodiment of the present invention.
Figure 20B:
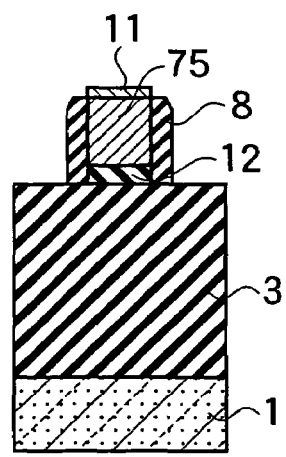
FIG. 20B is a schematic device cross-sectional diagram of an interconnect region for explaining a step of the nonvolatile semiconductor memory fabrication method according to the fourth embodiment of the present invention.

FIGS. 18A, 19A and 20A show as a fourth embodiment of the present invention a schematic device cross-sectional structure of a resistive element region in the other circuit regions 100 shown in FIG. 1. In addition, FIGS. 18B, 19B and 20B show as the fourth embodiment of the present invention, a schematic device cross-sectional structure of interconnect regions in the low voltage circuit regions 80, the high voltage circuit regions 90 and the other circuit regions 100 shown in FIG. 1. The resistive element regions and the interconnect regions according to the fourth embodiment of the present invention are all to be formed upon the device isolating regions 3. Furthermore, both of them may be able to be fabricated using the fabrication processes for the nonvolatile semiconductor memory according to the first through third embodiments of the present invention.

The resistive element region shown in FIG. 18A and the interconnect region shown in FIG. 18B are fabricated through the same process, which corresponds to the steps of FIG. 4 in the first embodiment, steps of FIG. 13 in the second embodiment, or steps of FIG. 16 in the third embodiment.

Similarly, the resistive element region shown in FIG. 19A and the interconnect region shown in FIG. 19B are fabricated through the same process, which corresponds to the steps of FIG. 5 in the first embodiment.

The resistive element region shown in FIG. 20A and the interconnect region shown in FIG. 20B are fabricated through the same process, which corresponds to the steps of FIGS. 6 through 9 in the first embodiment, steps of FIG. 14 in the second embodiment, or steps of FIG. 17 in the third embodiment.

The resistive element region, as shown in FIG. 18A, is formed from a second electrode film 76, which is patterned and formed upon the device isolating regions 3 in the semiconductor substrate via the seventh insulating film 12. On the other hand, the interconnect region, as shown in FIG. 18B, is formed from a second electrode film 75, which is patterned and formed on the device isolating regions 3 in the semiconductor substrate via the seventh insulating film 12.

(Fabrication Method)

A fabrication method for the resistive element region and for the interconnect region made from the second electrode film 7 in the nonvolatile semiconductor memory according to the fourth embodiment of the present invention are described referencing FIGS. 18 through 20.

The device isolating regions 3 are formed in the resistive element region followed by formation of the seventh insulating film 12 and the second electrode film 7, and afterwards, using the same steps as in FIGS. 4, 13, and 16, the second electrode film 7 or the resistive element region is then fabricated as a resistive element with a line width allowing a desired resistance (FIG. 18A).

Similarly, the device isolating regions 3 are formed in the interconnect region followed by formation of the seventh insulating film 12 and the second electrode film 7, and afterwards, using the same steps as in FIGS. 4, 13, and 16, the second electrode film 75 or the interconnect region is fabricated as an interconnect region with a line width allowing a desired resistance (FIG. 18B).

Line width processing may be performed with the objective of controlling a resistive value as the resistive element once ions have been implanted into the second electrode film 76.

Next, as with the high voltage circuit regions 14 and 90 in the nonvolatile semiconductor memory according to the first through third embodiments, forming a highly resistant resistive element region using the second electrode film 76 as well as highly integrating the resistive element region becomes possible by controlling the metallic salicide films 11 using the fourth insulating film 8, the fifth insulating film 9, and the sixth insulating film 10 (FIG. 19).

Similarly, regarding the interconnect region, as with the high voltage circuit regions 14 and 90 in the nonvolatile semiconductor memory according to the first through third embodiments, forming a low resistant interconnect region with the second electrode film 75 as well as highly integrating the interconnect region using the fourth insulating film 8 and the fifth insulating film 9 is possible as shown in FIG. 19B.

As with the high voltage circuit regions 90 in the nonvolatile semiconductor memory according to the first through third embodiments, since the p+ polysilicon gate electrode 73 or the n+ polysilicon gate electrode 74 may be used as it is, for the second electrode film 75, they can be formed simultaneously. Alternatively, in a separate step, the density of a to-be-added impurity may be increased.

Next, once the sixth insulating film 10 is deposited across the entirety, the fifth insulating film 9 and the sixth insulating film 10 on the second electrode film 74 are removed. Afterwards, the metallic salicide films 11 are formed to be electrically coupled with the second electrode film 75 through the metallic salicide process (FIG. 20). Here, formation of metallic salicide is possible simultaneous to the formation step for the metallic salicide films 11 carried out in the high voltage circuit regions 90, the low voltage circuit regions 80 or the cell array region 120 of the nonvolatile semiconductor memory according to the first through third embodiments.

The above fabrication process for the nonvolatile semiconductor memory according to the fourth embodiment of the present invention allows concurrent implementation of enhanced transistors in the low voltage circuit regions 80, and highly integrated, high breakdown voltage transistors in the high voltage circuit regions 90, as well as high integration and enhancement of the interconnect region and the resistive element region through the same process.

OTHER EMBODIMENT

As described above, the present invention is described according to the first through fourth embodiments; however, it should not be perceived that descriptions and drawings forming a part of this disclosure are intended to limit the spirit and scope of the present invention. Various alternative embodiments, working examples, and operational techniques will become apparent from this disclosure for those skills in the art.

A stacked gate structure is disclosed as the basic device structure of the memory cell transistors in the nonvolatile semiconductor memory according to the first through fourth embodiments; however, the present invention is not limited to this structure, and that structure may be a sidewall control gate structure, a MONOS structure or the like. Furthermore, a NAND, AND, or NOR type may be used for a specific circuit structure for the nonvolatile semiconductor memory according to the first through fourth embodiments. Moreover, various modifications and variations of in the fabrication process are possible.

As such, the present invention naturally includes various embodiments not described herein. Accordingly, the technical scope of the present invention is determined only by specified features of the invention according to the following claims that can be regarded appropriate from the above-mentioned descriptions.

In addition, the embodiments of the present invention can be modified and implemented in various ways as long as not deviating from the scope of the present invention. The present invention naturally includes various embodiments not described herein.

What is claimed is:

1. A nonvolatile semiconductor memory on a semiconductor chip, comprising:
    a cell array region configured with device isolating regions in a semiconductor substrate arranged in parallel to device activating regions in a memory cell transistor, which comprises a floating gate electrode, an insulating film formed on the floating gate electrode, a first control gate electrode stacked on the floating gate electrode via the insulating film, and a first metallic salicide film electrically coupled with the first control gate electrode;
    a high voltage circuit region including a high voltage transistor, which comprises a second metallic salicide film, a first source region and a first drain region, and a first gate region arranged between the first source region and the first drain region and electrically coupled with the second metallic salicide film;
    a low voltage circuit region including a low voltage transistor, which comprises a third metallic salicide film, a second source region and a second drain region electrically coupled with the third metallic salicide film, and a second gate region arranged between the second source region and the second drain region and electrically coupled with the third metallic salicide film; and
    a resistive element region electrically insulated from the first through third metallic salicide films,
    wherein the resistive element region is formed on the device isolating regions in the semiconductor substrate.

2. The nonvolatile semiconductor memory of claim 1, wherein both of the first gate region and the second gate region are configured as a single layer.

3. The nonvolatile semiconductor memory of claim 1, wherein the second metallic salicide film is electrically coupled with only a part of the first source region and the first drain region.

4. The nonvolatile semiconductor memory of claim 1, wherein,
    the first gate region further comprises a second control gate electrode stacked on the first gate region and electrically coupled therewith; and
    the second gate region further comprises a third control gate electrode stacked on the second gate region and electrically coupled therewith.

5. A nonvolatile semiconductor memory on a semiconductor chip, comprising:
    a cell array region configured with device isolating regions in a semiconductor substrate arranged in parallel to device activating regions in a memory cell transistor comprising a first metallic salicide film, a first control gate electrode electrically coupled with the first metallic salicide film, and a floating gate electrode adjacent to the first control gate electrode;
    a high voltage circuit region including a high voltage transistor made of a second metallic salicide film, a first source region and a first drain region, and a first gate region arranged between the first source region and the first drain region;
    a low voltage circuit region including a low voltage transistor made of a third metallic salicide film, a second source region and a second drain region electrically coupled with the third metallic salicide film, and a second gate region arranged between the second source region and the second drain region and electrically coupled with the third metallic salicide film;
    a fourth metallic salicide film arranged on the semiconductor chip;
    an interconnect region electrically coupled with the fourth metallic salicide film; and
    a resistive element region electrically insulated from the first through fourth metallic salicide films,
    wherein the resistive element region is formed on the device isolating regions in the semiconductor substrate.

6. The nonvolatile semiconductor memory of claim 5, wherein, the first gate region further comprises a second control gate electrode stacked on the first gate region and electrically coupled therewith; and the second gate region further comprises a third control gate electrode stacked on the second gate region and electrically coupled therewith.

7. The nonvolatile semiconductor memory of claim 1, further comprising:
- a fourth metallic salicide film arranged on the semiconductor chip; and
- an interconnect region electrically coupled with the fourth salicide film.

8. A nonvolatile semiconductor memory on a semiconductor chip, comprising:
- a cell array region configured with device isolating regions in a semiconductor substrate arranged in parallel to device activating regions in a memory cell transistor comprising a first metallic salicide film, a first control gate electrode electrically coupled with the first metallic salicide film, and a floating gate electrode adjacent to the first control gate electrode;
- a high voltage circuit region including a high voltage transistor made of a second metallic salicide film, a first source region and a first drain region, and a first gate region arranged between the first source region and the first drain region;
- a low voltage circuit region including a low voltage transistor made of a third metallic salicide film, a second source region and a second drain region electrically coupled with the third metallic salicide film, and a second gate region arranged between the second source region and the second drain region and electrically coupled with the third metallic salicide film, wherein the second metallic salicide film is electrically coupled with only a part of the first source region and the first drain region;
- a fourth metallic salicide film arranged on the semiconductor chip;
- an interconnect region electrically coupled with the fourth metallic salicide film; and
- a resistive element region electrically insulated from the first through fourth metallic salicide films,
- wherein the resistive region is formed on the device isolating regions in the semiconductor substrate.

9. The nonvolatile semiconductor memory of claim 3, further comprising:
- a fourth metallic salicide film arranged on the semiconductor chip;
- an interconnect region electrically coupled with the fourth metallic salicide film; and
- a resistive element region electrically insulated from the first through fourth metallic salicide films.

10. The nonvolatile semiconductor memory of claim 6, further comprising:
- a fourth metallic salicide film arranged on the semiconductor chip;
- an interconnect region electrically coupled with the fourth metallic salicide film; and
- a resistive element region electrically insulated from the first through fourth metallic salicide films.

11. The nonvolatile semiconductor memory of claim 4, further comprising:
- a fourth metallic salicide film arranged on the semiconductor chip;
- an interconnect region electrically coupled with the fourth metallic salicide film; and
- a resistive element region electrically insulated from the first through fourth metallic salicide films.

12. The nonvolatile semiconductor memory of claim 7, wherein
- both of the first source region and the first drain region comprise a plurality of first diffusion regions of low impurity concentration,
- both of the first source region and the first drain region comprise a second diffusion region of high impurity concentration arranged in between the first diffusion regions, and
- the fourth metallic salicide film is formed on the second diffusion region of high impurity concentration.

\* \* \* \* \*